United States Patent [19]

Cheng et al.

[11] Patent Number: 5,587,919
[45] Date of Patent: Dec. 24, 1996

[54] APPARATUS AND METHOD FOR LOGIC OPTIMIZATION BY REDUNDANCY ADDITION AND REMOVAL

[75] Inventors: Kwang-Ting Cheng, Santa Barbara, Calif.; Luis Entrena, Madrid, Spain

[73] Assignee: Lucent Technologies, Inc., Murray Hill, N.J.

[21] Appl. No.: 233,791

[22] Filed: Apr. 22, 1994

[51] Int. Cl.⁶ .................................................. G06F 17/50
[52] U.S. Cl. .......................................... 364/489; 364/488
[58] Field of Search ................................. 364/488, 489, 364/490, 491, 578; 395/500

[56] References Cited

U.S. PATENT DOCUMENTS

| | | | |
|---|---|---|---|
| 4,703,435 | 10/1987 | Darringer et al. | 364/489 |
| 4,816,999 | 3/1989 | Berman et al. | 364/489 |
| 4,882,690 | 11/1989 | Shinsha et al. | 364/490 |
| 5,003,487 | 3/1991 | Drumm et al. | 364/489 |
| 5,029,102 | 7/1991 | Drumm et al. | 364/489 |
| 5,146,583 | 9/1992 | Matsunaka et al. | 395/500 |
| 5,159,682 | 10/1992 | Toyonaga et al. | 395/500 |
| 5,243,538 | 9/1993 | Okuzawa et al. | 364/489 |
| 5,257,201 | 10/1993 | Berman et al. | 364/489 |
| 5,461,574 | 10/1995 | Matsunaga et al. | 364/489 |

OTHER PUBLICATIONS

Brayton et al., "Multilevel Logic Synthesis", IEEE, vol. 78, No. 2, Feb. 90, pp. 264–300.
Augustin et al., "Verification of VHDL Design Using VAL", IEEE, 1988, pp. 48–53.
Sheldon B. Akers, "Binary Decision Diagrams," IEEE, 1978, pp. 509–516.
Bostick, D. et al. "The Boulder Optimal Logic Design System," *Proc. of Int'l Conf. on CAD*, Nov. 1987, pp. 62–65.
Cheng, K.-T. and Entrena, Luis A., "Multi–Level Logic Optimization by Redundancy Addition and Removal," *Proc. European Conf. on Design Automation (EDAC–93)*, Feb. 1993, pp. 373–377.
Entrena, Luis A. and Cheng, K.-T., "Sequential Logic Optimization by Redundancy Addition and Removal," *Proc. of Int'l Conf. on CAD*, 1993, pp. 310–315.
Cho et al., "Redundancy Identification and Removal based on Implicit State Enumeration," IEEE, pp. 77–80.

Primary Examiner—Kevin J. Teska
Assistant Examiner—Thai Phan

[57] ABSTRACT

A method is disclosed for optimizing a digital logic network through the iterative addition and removal of redundant connections. Redundancy testing is performed on connections absolutely dominated by the node of the network being optimized to find redundant connections and connections that can be added to the network which would create more redundant connections elsewhere in the network which may under appropriate conditions be removed to simplify the network. Application of the redundancy addition and removal network optimization technique to selected connections in a network improves the cost efficiency of network optimization because a network is optimized by the consideration of a reduced number of candidate connections for addition.

38 Claims, 15 Drawing Sheets

APPARATUS AND METHOD FOR LOGIC OPTIMIZATION BY REDUNDANCY ADDITION AND REMOVAL

FIELD OF THE INVENTION

This invention relates generally to digital logic network optimization. More particularly, the present invention relates to a method for optimizing multi-level combinational and sequential logic networks through the iterative addition and removal of redundant connections.

BACKGROUND OF THE INVENTION

The optimization of a digital network is achieved by minimizing the number of logic components and connections that are required to implement the logic function of a network. A digital logic network basically consists of one or more gates or flip-flops that are interconnected by wires to form combinational or sequential circuits. Network optimization is the process of identifying those wires, gates and flip-flops that can be removed from a network, known as redundant connections or redundancies, without changing the functionality of the network. General purpose computer systems are used to perform the operative steps of network optimization.

Optimization of a network achieves a more efficient and cost effective implementation of the particular logic function of the network. The cost of synthesizing a network, in part, is related to the total number of wires, gates or flip-flops comprising a network. The removal of more and more connections and logic components from a network without changing the functionality of the network lowers the manufacturing cost associated with producing a chip which implements the particular logic function of a digital logic network.

The cost of a network is also a function of the computational cost or the amount of engineering time and computer time expended in optimizing a network. For an extremely large and complex network consisting of hundreds of thousands and even millions of connections and logic components, computational costs can attain such high levels that any cost reduction achieved by the minimization of the network is overcome by the computational cost of computer processing time expended in performing an optimization on the network and of the extended length of production time for realizing a finalized implementation of the desired logic network.

Various network optimization techniques are well known in the art. The feasibility of using any of these techniques in the synthesis of a network, therefore, depends on the extent a network is minimized by the performance of a network optimization routine and the related computational costs. For example, all possible redundancies in a network cannot be identified using the Boolean Resubstitution in the BOLD network optimization system described in D. Bostick et al., *The Boulder Optimal Logic Design System*, Proc. of Int'l Conf. on CAD (1987) at 62–65 and incorporated by reference herein. Other techniques well known in the art also do not provide for the identification of all redundancies in a network.

Among other well known network optimization techniques, the redundancy addition and removal (RAR) technique, first described in K. -T. Cheng and L. A. Entrena, *Multi-Level Logic Optimization by Redundancy Addition and Removal, Proc. European Conf. on Design Automation* (1993) at 373–77 and incorporated by reference herein, provides a most effective method for optimizing a network. RAR identifies redundant connections which can be added to a network that create a greater number of redundancies which can be removed from the network and allows for the simultaneous addition and removal of redundancies during optimization. RAR also provides a technique for multi-level minimization of sequential circuits without any restrictions in their structure.

Application of the RAR approach to the optimization of a digital network, however, also has several shortcomings. The RAR network optimization technique is implemented by the performance of redundancy testing on all connections in a network. The examination of all connections of a very large and complex network as part of an attempt to optimize the network, in most circumstances, greatly increases the computational cost for designing a network. Usually, only a very small percentage of the connections in a large and complex network are redundant and even a smaller percentage of these connections would create redundancies. Therefore, for an extremely large network, it becomes extremely complex and time consuming to determine for all possibilities whether connections should be added or not. In addition, in certain circumstances, computational costs are further aggravated by the examination of every single connection of a network because the determination of whether a network connection or a connection suggested for addition is redundant can itself be very time consuming.

SUMMARY OF THE INVENTION

The present invention provides an efficient method for optimizing a digital logic network by iteratively adding and removing redundancies. Each node in a network is optimized by the performance of redundancy testing only on those connections in the network which are in the input tree of the node selected for optimization, known as the target node, and not shared with other nodes. Data collected based on the mandatory assignment values implicated during redundancy testing of these connections is used to guide the search for candidates for redundancy addition. A candidate connection is added to a network only if it is redundant and it creates redundant connections elsewhere in the network which upon removal would minimize the network without changing the external behavior of the network. A candidate connection found redundant, however, is not added to a network where the connection made redundant by the addition of that candidate connection would tend to prevent the removal of more redundant connections at a later stage in optimization.

In one embodiment, the method of this invention achieves optimization of a network by selecting a target node for optimization; creating a partial fault list for those connections absolutely dominated by the target node; performing redundancy testing on each fault in the partial fault list, removing redundant faults and identifying candidate connections for addition as suggested by the mandatory assignment values implicated during redundancy testing of each of the faults in the partial fault list; sorting and processing candidate connections for addition to determine whether addition to the network will result in reduction of the size of the network; and indicating a representation of the optimized network.

Further, the method of this invention may be performed by selecting the highest cost node of the network as a target node for optimization, or by selecting each node of the network as a target node for optimization in descending cost order. Still further, the method of the invention may be performed on all the nodes of a network for a set number of iterations or repeatedly until an optimization iteration does not further transform the network.

The many advantages of the present invention will be readily apparent from the detailed description and the drawings that follow.

DETAILED DESCRIPTION

Figure 1:
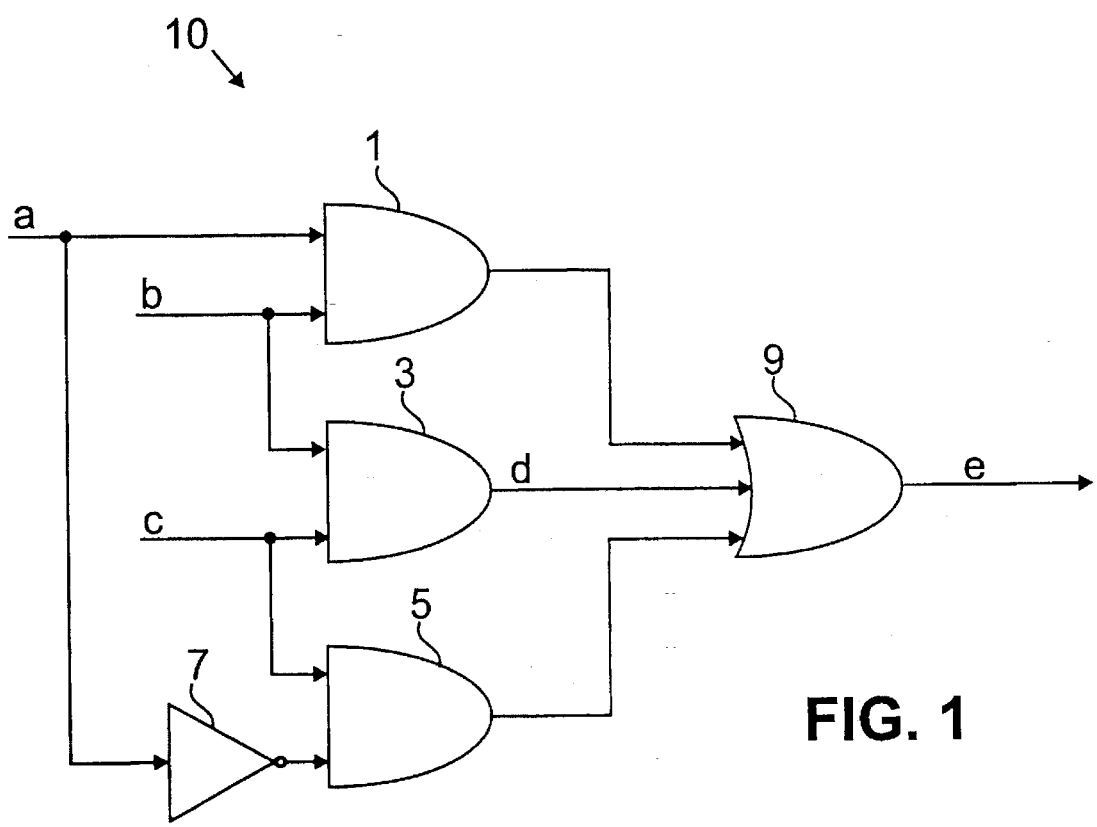
FIG. 1 is a network used to illustrate network optimization concepts.
Figure 2A:
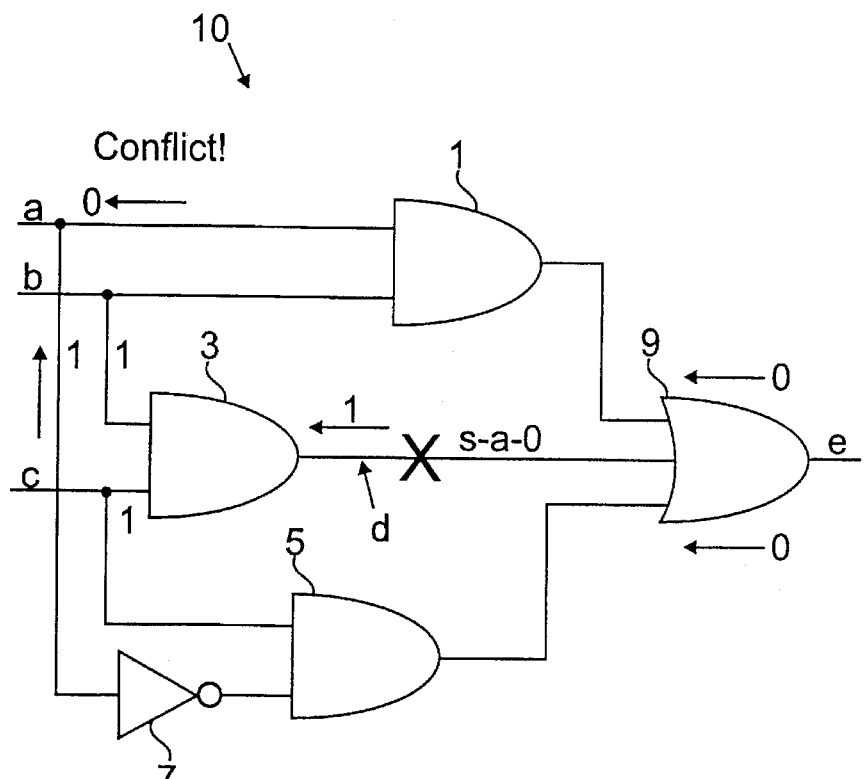
FIG. 2(a) illustrates how network optimization is performed on the network shown in FIG. 1.
Figure 2B:
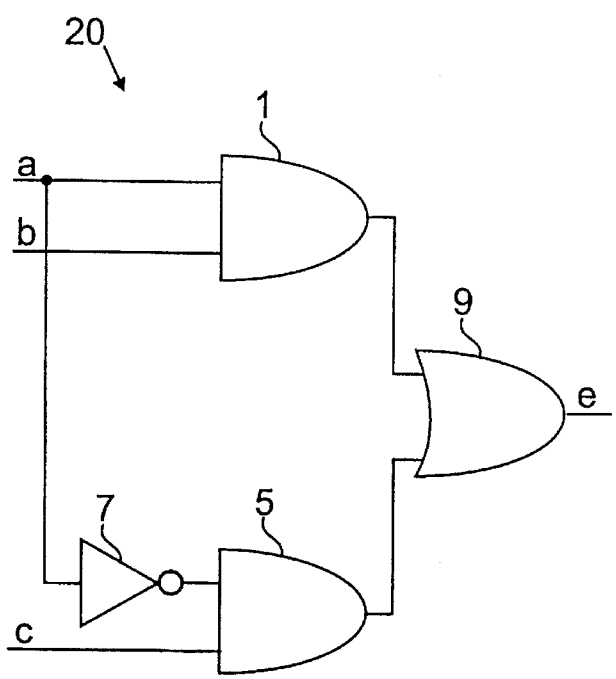
FIG. 2(b) is an optimized version of the network shown in FIG. 1.

In order to understand the advantages of the present invention, a digital network optimizer and method of optimization, several network optimization concepts must be defined. FIGS. 1, 2(a) and 2(b) show the steps involved in the performance of network optimization on a sample network and are used to illustrate important network optimization concepts. FIG. 1 shows a combinational network 10. FIG. 2(a) shows a reproduction of network 10 and indicates the results of redundancy testing on one of the connections in network 10. FIG. 2(b) shows a network 20 which is the optimized version of the network 10. The structure of network 20 is derived from the results of the redundancy testing performed on the connection in network 10.

As shown in FIG. 1, network 10 consists of three dual-input AND gates 1, 3 and 5, an invertor 7, and a three-input OR gate 9. The outputs of the AND gates 1, 3 and 5 are each connected as an input to the OR gate 9. An input signal a is connected as an input to the AND gate 1 and the invertor 7. An input signal b is connected as an input to the AND gates 1 and 3, and an input signal c is connected as an input to the AND gates 3 and 5. The output of invertor 7 is connected to an input of AND gate 5. For purposes of explaining network optimization concepts using the network 10, a connection connecting the output of the AND gate 3 as an input to the OR gate 9 is designated connection d and the output of OR gate 9 is designated output e.

A node in a network is defined as either a primary input, a primary output, or a functional gate with more that one input. Inverters are not considered nodes. Therefore, for the network 10, the primary inputs are a, b and c, the primary output is e, and the functional gates are the AND gates 1, 3 and 5 and the OR gate 9.

A connection is the set of edges connecting two nodes and is characterized by a triple (S, D, P), where S is the source node, D is the destination node and P is the polarity (1 for inverted and 0 for non-inverted). In network 10, the connection d connects the nodes 3 and 9 and is characterized as the triple (3, 9, 0).

The logic value of an input to a functional gate in a circuit is said to be controlling of the gate if it controls the logic value of the gate output irrespective of the values of the other gate inputs. The controlling value is "1" for an OR or a NOR gate, and "0" for an AND or a NAND gate. The inverse of the controlling value is called the sensitizing value. The sensitizing value is a logic value set at all inputs to a functional gate except for the logic value at a selected input to that gate that enables the logic value at the selected input to be propagated forward through the gate. For example, for an AND gate, the sensitizing value "1" is set at all inputs except the selected input, and for an OR gate the sensitizing value "0" is set at all inputs except the selected input.

A connection is combinationally or sequentially redundant if it can be removed without affecting the external behavior of the combinational or sequential network. Before a connection can be removed from a network, a test is performed to determine whether removal of the connection will change the functionality of the network. This verification process is known as redundancy testing.

A redundancy test is performed on a connection by first identifying the destination node corresponding to the connection. The type of functional gate comprising the destination node of the connection determines the equivalent effect of removing the connection from the circuit. For instance, the removal of a connection to a destination node OR gate is equivalent to saying that the input to the destination node OR gate corresponding to the connection removed from the destination node OR gate is always at the value "0" or, using network optimization syntax, that the connection stuck-at 0 fault is redundant. Similarly, the removal of a connection to a destination node AND gate is equivalent to saying that the input to the destination node AND gate corresponding to the connection to the destination node AND gate is always at the value "1" or that the connection stuck-at 1 fault is redundant. For other types of functional gates, the logic value corresponding to the stuck-at value for a fault is the same logic value as the sensitizing value for the particular functional gate.

In order to test whether the removal of a connection does not change the functionality of the network, in other words, to test that a fault is redundant, the stuck-at fault corresponding to the connection is set to the controlling value for the destination node of the connection. To observe the effect of removing the fault from the network, all side inputs to mandatory observation nodes, or nodes that must be visited when propagating the fault effect to at least a primary output, are set to a sensitizing value. Based on the controlling value for the stuck-at-1 fault and the values set at the side inputs of any mandatory observation nodes, other values are assigned or implicated at other nodes in the network. These assigned values known as implied mandatory assignment values are the only values which need to be considered in order to determine whether a connection is redundant. The process of implicating values to nodes in a network based on mandatory assignment values is known as the justification of assignment values.

Therefore, for a given fault f, a set of mandatory assignments, SMA(f), is computed. The justification of the mandatory assignments may imply mandatory values at some nodes. These implied mandatory values are computed via implication of the mandatory assignments in SMA(f) until no further implication is possible. If it is determined that a certain connection must be assigned one value to satisfy one implication and another value to satisfy another implication, a conflict exists as to what value is assigned to a node. The presence of this conflict is equivalent to saying that an inconsistency in the SMA for the fault f is present. In the case where the mandatory assignments for a fault f cannot be consistently justified, the fault is redundant. A finding that a fault is redundant allows the simplification of the circuit by the removal of at least a gate or a gate input that corresponds to the redundant fault. If the set of mandatory assignments for the fault f can be consistently justified, the fault f is not redundant or, in other words, it is irredundant. An irredundant fault cannot be removed from a circuit because its removal would change the external output behavior of the network.

The concepts of redundancy testing are now illustrated by the performance of redundancy testing on a connection in a network. Redundancy testing will be performed on connection d in the network 10, as the characteristics of this particular connection best illustrate the above principles. The results of redundancy testing on connection d of the network 10 are shown in FIG. 2(a). Performing redundancy testing on connection d is equivalent to saying that the AND gate node 3 is set equal to "0" or fault 3 is stuck-at-0. The condition of a connection fault being "stuck-at-0" or "stuck-at-1" is indicated in FIG. 2(a) and in other figures, respectively, by the abbreviation "s-a-0" and "s-a-1".

To perform redundancy testing on fault 3 stuck-at-0, fault 3 must be set to the controlling value "1". In addition, the outputs of the AND gate node 1 and the AND gate node 5, known as the side inputs 1 and 5 to the mandatory observation node OR gate 9, are set to the sensitizing value for an OR gate or "0". The mandatory assignment of the controlling value "1" to AND gate node 3 requires that the inputs b and c to AND gate node 3 be set equal to "1". Also, since input b is equal to "1" and AND gate node 1 is equal to "0" input a to AND gate node 1 must be equal to "0". A conflict, however, arises in implicating the set of mandatory assignments for fault 3 stuck-at-0.

Further implication of mandatory assignment values based on the condition of AND gate node 5 equal to "0" requires that input a must equal "1" because input c as the other input to AND gate node 5 is equal to "1". As shown in network 10 as reproduced in FIG. 2(a), input a to the AND gate node 5 is inverted by the invertor 7 before it becomes an input to the AND gate node 5. Therefore, for AND gate node 5 equal to "0" and input c equal to "1", input a must be equal to "1". The presence of this conflict indicates that the set of the mandatory assignments for the fault 3 stuck-at-0 is not consistent, or fault 3 stuck-at-0 is redundant.

In other words, the connections corresponding to fault 3 can be removed from the network without affecting the external behavior at output e of the OR gate node 9, irrespective of any input combination at inputs a, b and c. The removal of redundant fault 3 from the network is equivalent to the elimination from the network of connection d, AND gate 3 and the respective inputs to AND gate 3. The optimized version of the network 10 with the redundant connections corresponding to fault 3 removed is shown as network 20 in FIG. 2(b).

For purposes of explaining the novelty of the inventive method, an understanding of the term absolute dominator is also required. In a network, a node Q is a dominator of another node R in the network with respect to an output O if and only if every path from the output O to the dominated node R passes through the dominator node Q. A dominator of a node R is an absolute dominator of the node R, if, and only if, it is a dominator with respect to all reachable outputs. A node Q is an absolute dominator of a connection triple (Q, R, -) if it is an absolute dominator of the destination gate R. For a gate input fault to node Q, the absolute dominators of node Q are mandatory observation nodes. For a gate output fault at node Q, the absolute dominators of node Q, except Q node itself, are mandatory observation nodes. To illustrate, in the network 10 as shown in FIG. 1, AND gate nodes 1, 3 and 5 are absolutely dominated by OR gate node 9. Also, OR gate node 9 absolutely dominates inputs a, b, and c and the connections between the outputs of the AND gate nodes 1, 3, and 5 and each respective input to OR gate node 9.

Figure 3:
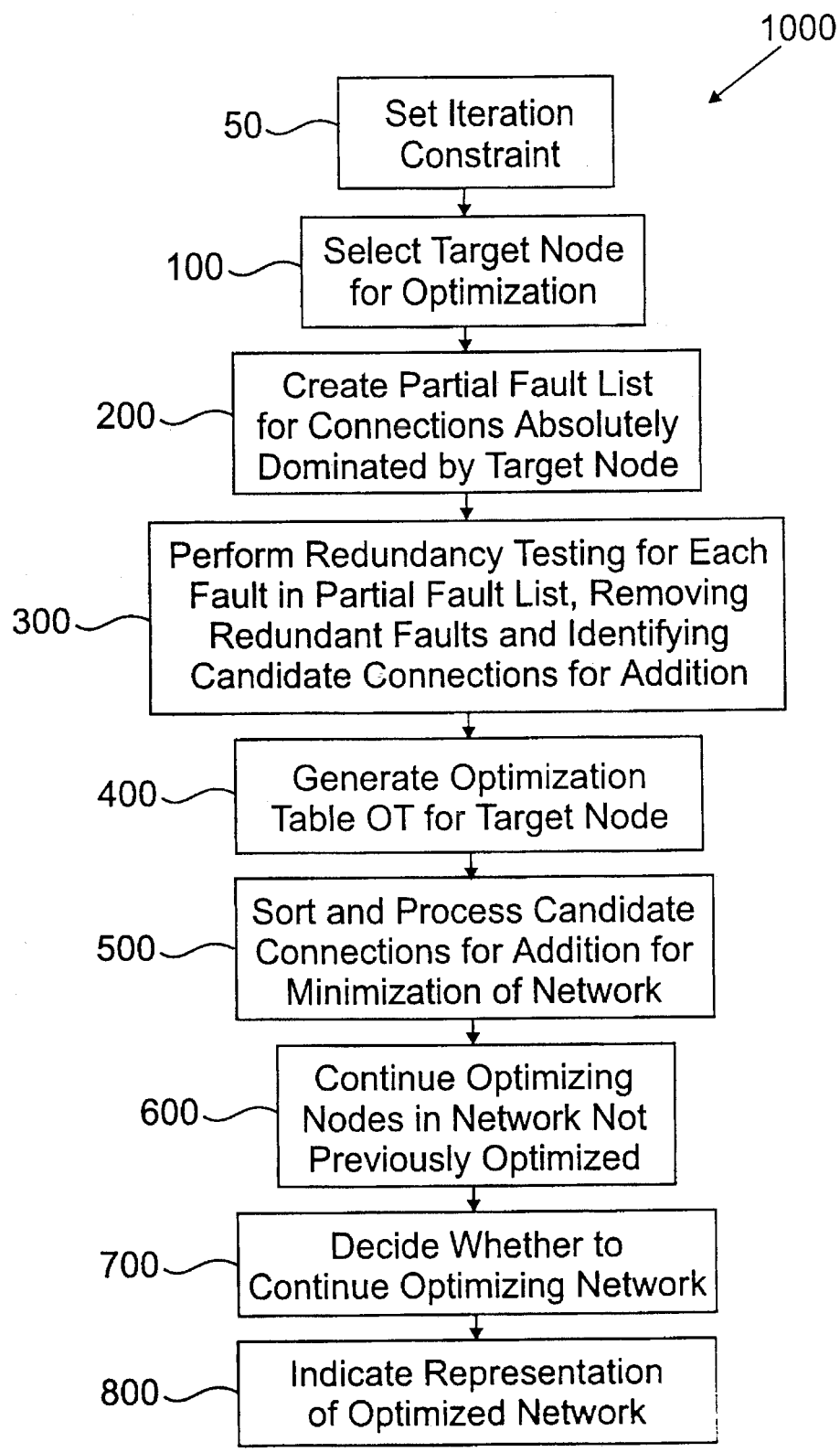
FIG. 3 is a high level flowchart illustrating the present invention.

The preferred embodiment of the invention is implemented as a digital network optimizer. The digital network optimizer optimizes a network by performing the steps in an optimization process 1000 as shown in the high level flowchart of FIG. 3. The optimization process 1000 comprises flow-steps 50 through 800. Performance of these flow-steps results in the optimization of the network in a cost efficient manner by the iterative addition and removal of redundancies using the concept of mandatory assignments to guide the suggestions for addition and removal. The integrated approach of obtaining mandatory assignments to suggest candidate connections from the redundancy testing of select faults of a target node is a significant advantage over the Boolean resubstitution paradigm and other known methods, and provides for a more efficient method for optimizing much larger networks.

Optimization of a network by the digital network optimizer begins with the flow-step 50, where an upper constraint may be set on the number of times that the digital network optimizer performs an optimization iteration on the network. An optimization iteration is defined as the optimization of each node in the network once, and corresponds to performance of flow-steps 100, 200, 300, 400, 500 and 600 of the optimization process 1000 until the point at which flow-step 700 is about to be performed. These flow-steps are explained in further detail below. If no upper constraint is set in the flow-step 50, optimization iterations on the network continue until no further network transformation is achieved upon completion of an optimization iteration.

After flow-step 50, the digital network optimizer performs an optimization iteration on the network. The first step of the optimization iteration is the flow-step 100. In flow-step 100, a node from the network having the greatest number of connections absolutely dominated by it, known as the highest cost node, is selected as the target node for optimization. After this target node has been completely optimized by the performance of flow-steps 200, 300, 400, and 500, which are explained in further detail below, each node of the network not previously optimized is selected in cost descending order as a target node for optimization and then also optimized by the performance of flow-steps 200, 300, 400, and 500. A more detailed description of the steps performed in the flow-step 100 is provided below with reference to FIG. 4.

For each target node selected in the flow-step 100, the digital network optimizer in flow-step 200 creates a partial fault list. The partial fault list is a list of the faults corresponding to those connections absolutely dominated by the target node being optimized.

Figure 5:
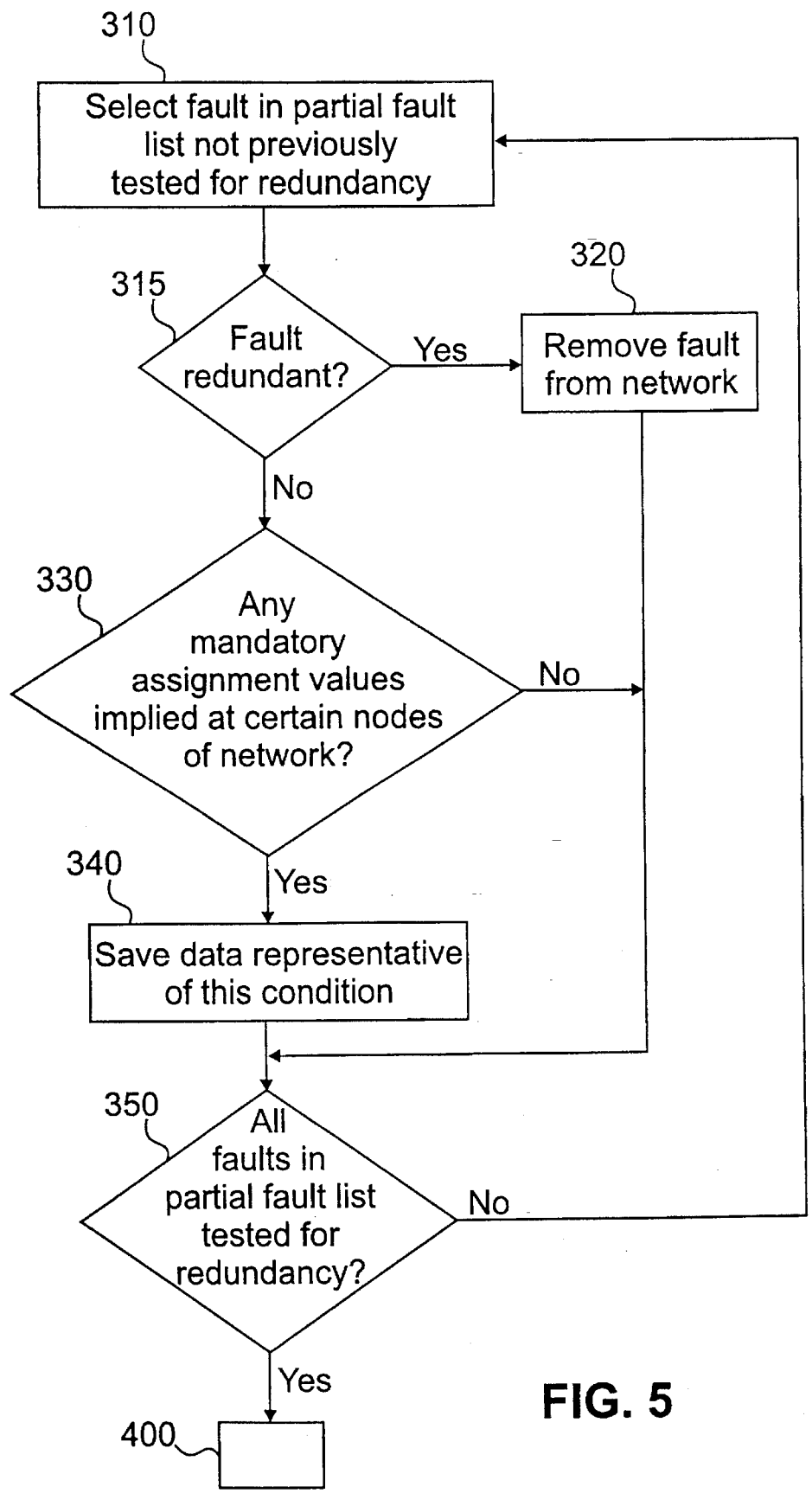
FIG. 5 is a flow diagram for the performance of redundancy testing on partial faults, the removal of redundant faults and the identification of candidate connections for addition.

After a partial fault list is generated for a target node in the flow-step 200, the digital network optimizer in flow-step 300 performs redundancy testing on each fault in the partial fault list. Any fault found redundant is removed from the network. Also as part of the flow-step 300, the mandatory assignment values implicated during redundancy testing of each of the faults in the partial fault list are used to identify candidate connections for addition. Data representing these suggested candidate connections is saved in memory for later processing. The techniques used to identify candidate connections for addition from the mandatory assignment values implicated during redundancy testing are described in detail below. Details of the steps performed in the flow-step 300 are shown in FIG. 5 and described further below.

After the flow-step 300 is completed, the digital network optimizer in flow-step 400 uses the data collected in flow-step 300 concerning the suggested candidate connections to generate an optimization table for the target node being optimized. Generation of an optimization table facilitates the process of determining whether redundancies can be added and removed from the network so as to minimize the network. The steps for generating an optimization table in flow-step 400 are further described below and set forth in FIG. 6.

Figure 7:
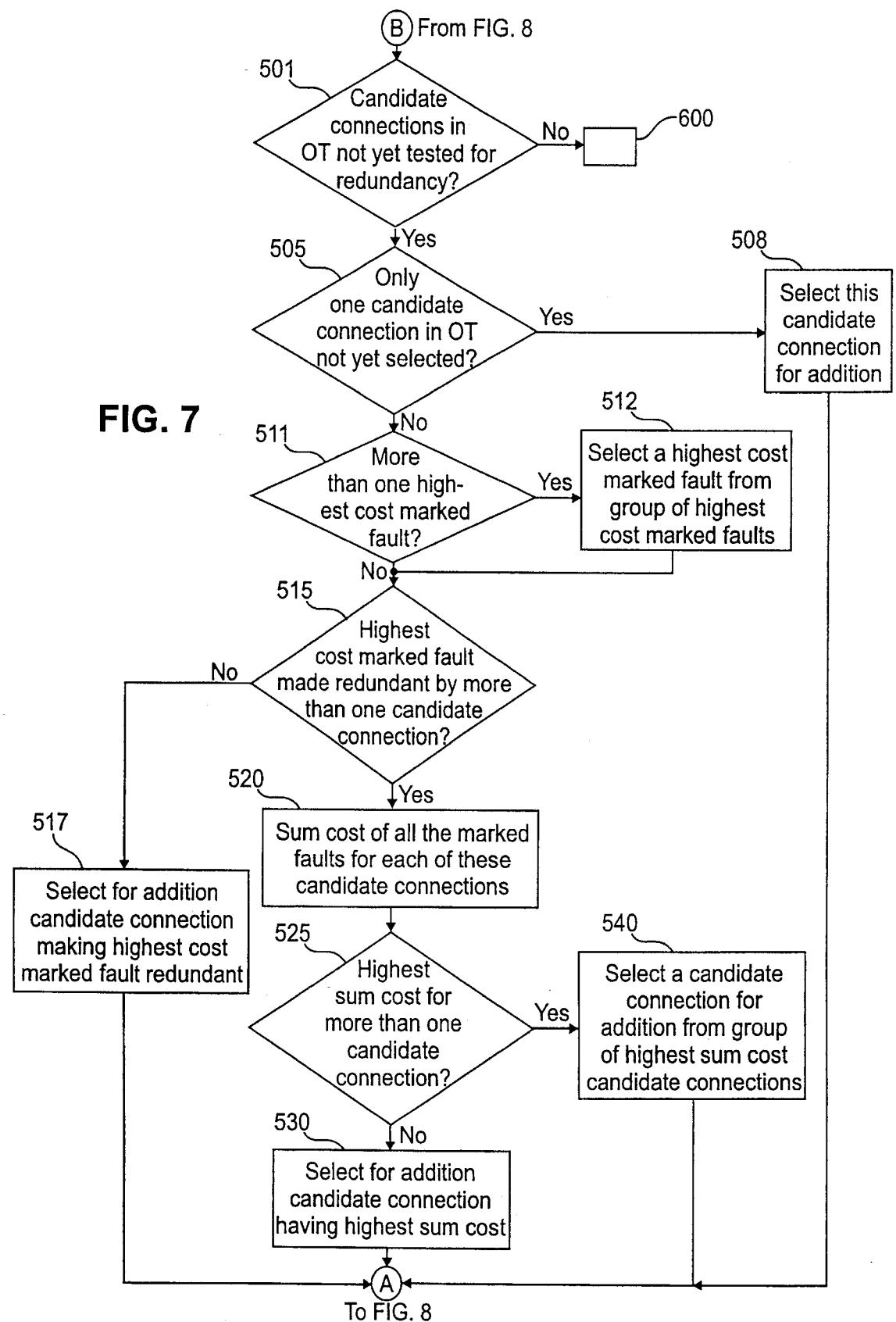
FIG. 7 is a flow diagram for the selection of candidate connections for addition.

In flow-step 500, the digital network optimizer uses the optimization table generated in the flow-step 400 to sort and process any candidate connections for addition to the target node. Flow-step 500 is divided into three parts. First, a candidate connection for addition is selected. Second, redundancy testing is performed on this candidate connection. Third, depending on whether the candidate connection is found redundant, other connections made redundant by the addition of this candidate connection are removed only if the addition furthers minimization of the network. The detailed steps for the first part of flow-step 500 of selecting a candidate connection are explained below with reference to FIG. 7. Further, the detailed steps of the second and third parts of flow-step 500 concerning redundancy testing of a candidate connection and the addition and removal decision criteria are explained further below with reference to FIG. 8.

After optimization of a target node has been completed by the performance of the flow-steps 200, 300, 400, and 500, the digital network optimizer in flow-step 600 determines whether any nodes in the network have not been previously optimized. If at least one node has not been optimized, the digital network optimizer then performs the flow-steps 100, 200, 300, 400 and 500 on this target node and all other nodes in the network that have not been previously optimized until all nodes of the network have been optimized. An optimization iteration is completed at the point where the digital network optimizer in flow-step 600 determines that all nodes of the network have been optimized.

Figure 9:
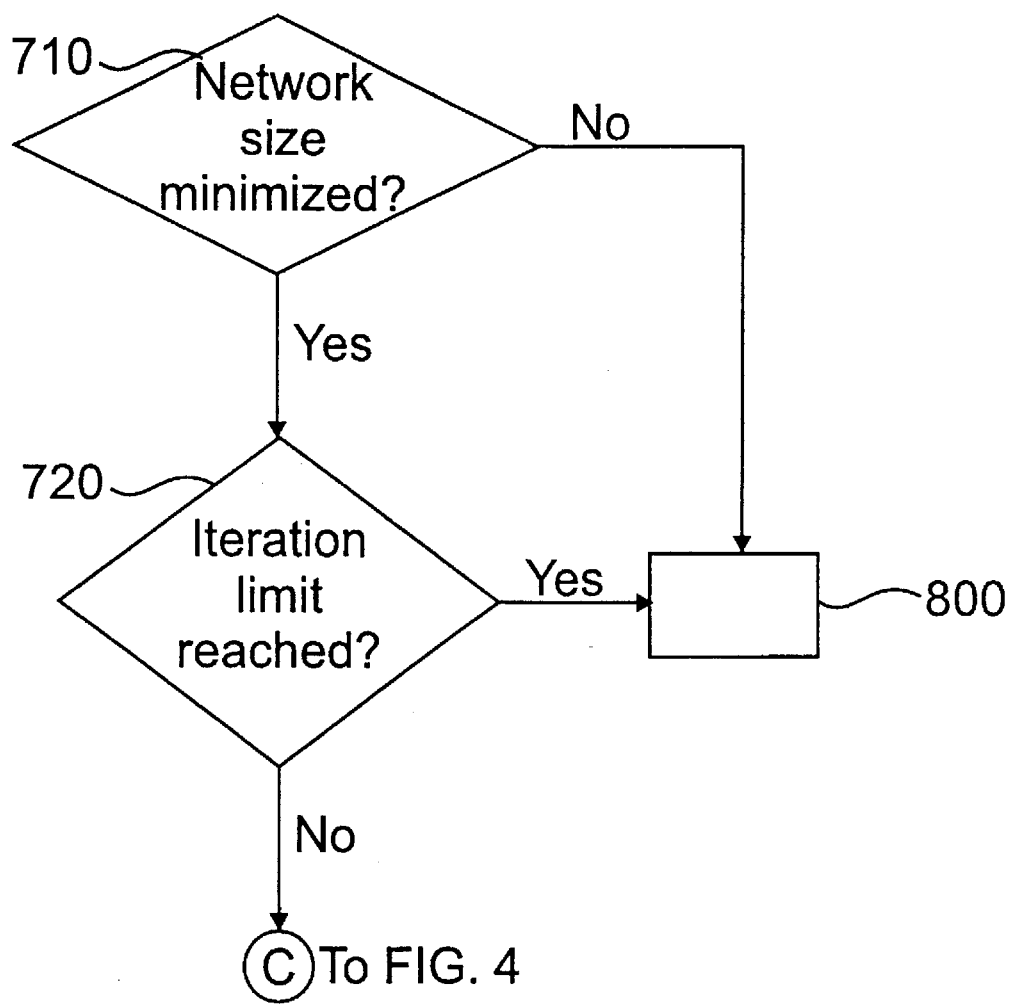
FIG. 9 is a flow diagram for the determination whether to perform another optimization iteration on the network.

After the completion of an optimization iteration, the digital network optimizer in flow-step 700 determines whether to perform another optimization iteration on the network. The decision to continue optimizing the network depends upon whether the iteration just completed has further optimized the network or whether an upper constraint on the number of iterations to be performed has been attained. A detailed description of the steps performed in flow-step 700 is described below with reference to FIG. 9.

If the digital network optimizer in flow-step 700 determines that no further iterations are to be performed, the digital network optimizer in the flow-step 800 indicates a representation of the network as optimized.

Figure 10:
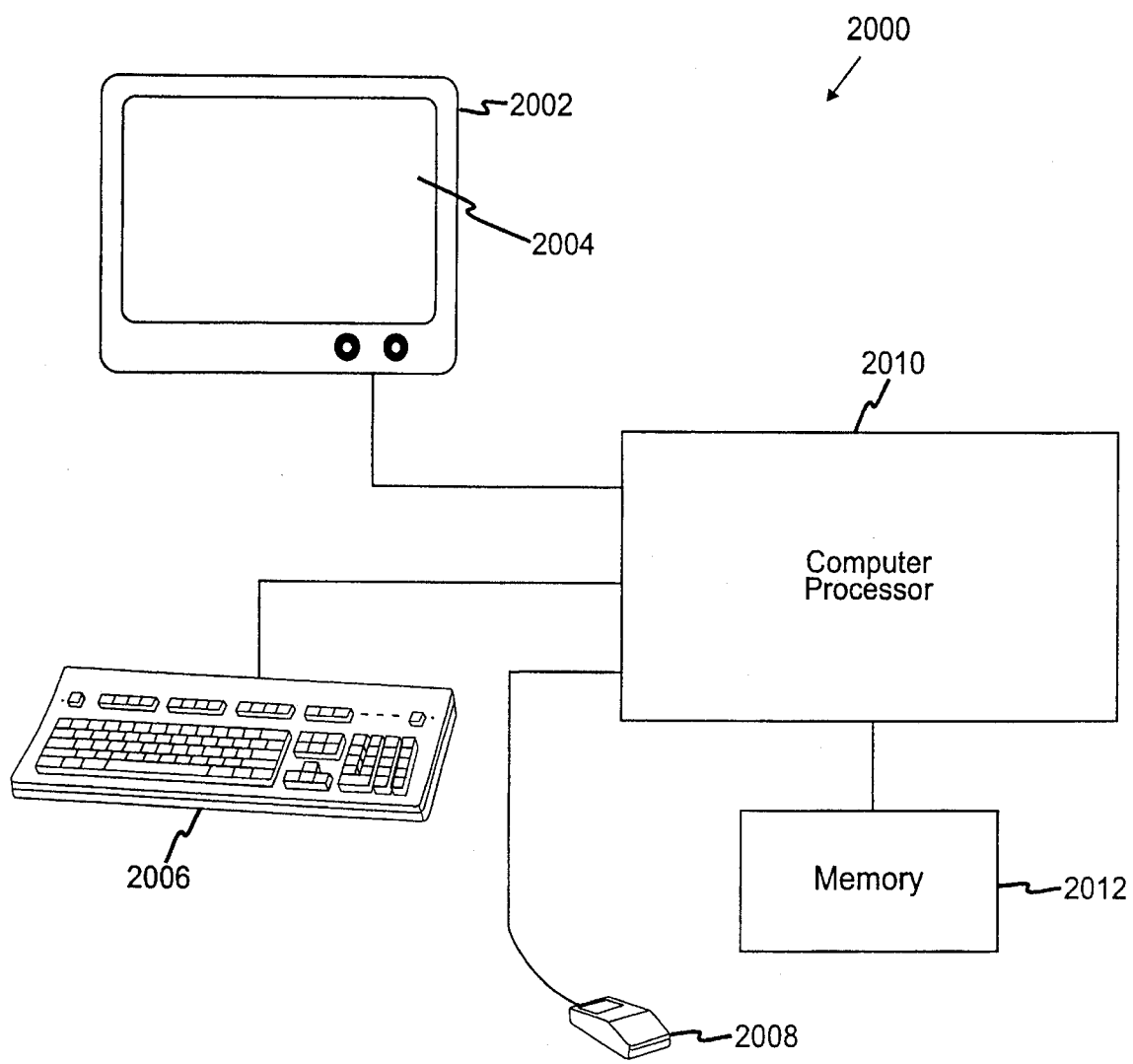
FIG. 10 illustrates apparatus for implementing the present invention.

One embodiment of the present invention may be implemented using a general purpose computer system such as the one illustrated in FIG. 10. FIG. 10 shows a general purpose computer system 2000 comprising a graphical display monitor 2002 with a graphics screen 2004 for the display of graphical and textual information, a keyboard 2006 for the textual entry of information, a mouse 2008 for the entry of graphical data, a computer processor 2010 and a memory 2012. In this embodiment of the invention, the computer processor 2010 contains program code suitable for implementing the optimization process 1000. The computer processor 2010 is connected to the graphical display monitor 2002, the keyboard 2006, the mouse 2008 and the memory 2012. Other graphical entry devices, such as a light pen (not shown), can be substituted for the mouse. This general purpose computer may be one of the many types well known in the art, such as a mainframe computer, a minicomputer, a workstation, or a personal computer.

For purposes of describing the methods of this invention as implemented by a general purpose computer, the suitably programmed computer processor 2010 is referred to as a digital network optimizer. A representation of the network to be optimized by the digital network optimizer is entered into the memory 2012 either by use of the keyboard 2006, the mouse 2008 or in some other well known fashion. Memory 2012 provides a store for data from which the structure of the network can be simulated for processing by the digital network optimizer and for data representing those connections suggested for addition, those connections actually added to the network, and those connections removed from the network.

Figure 11:
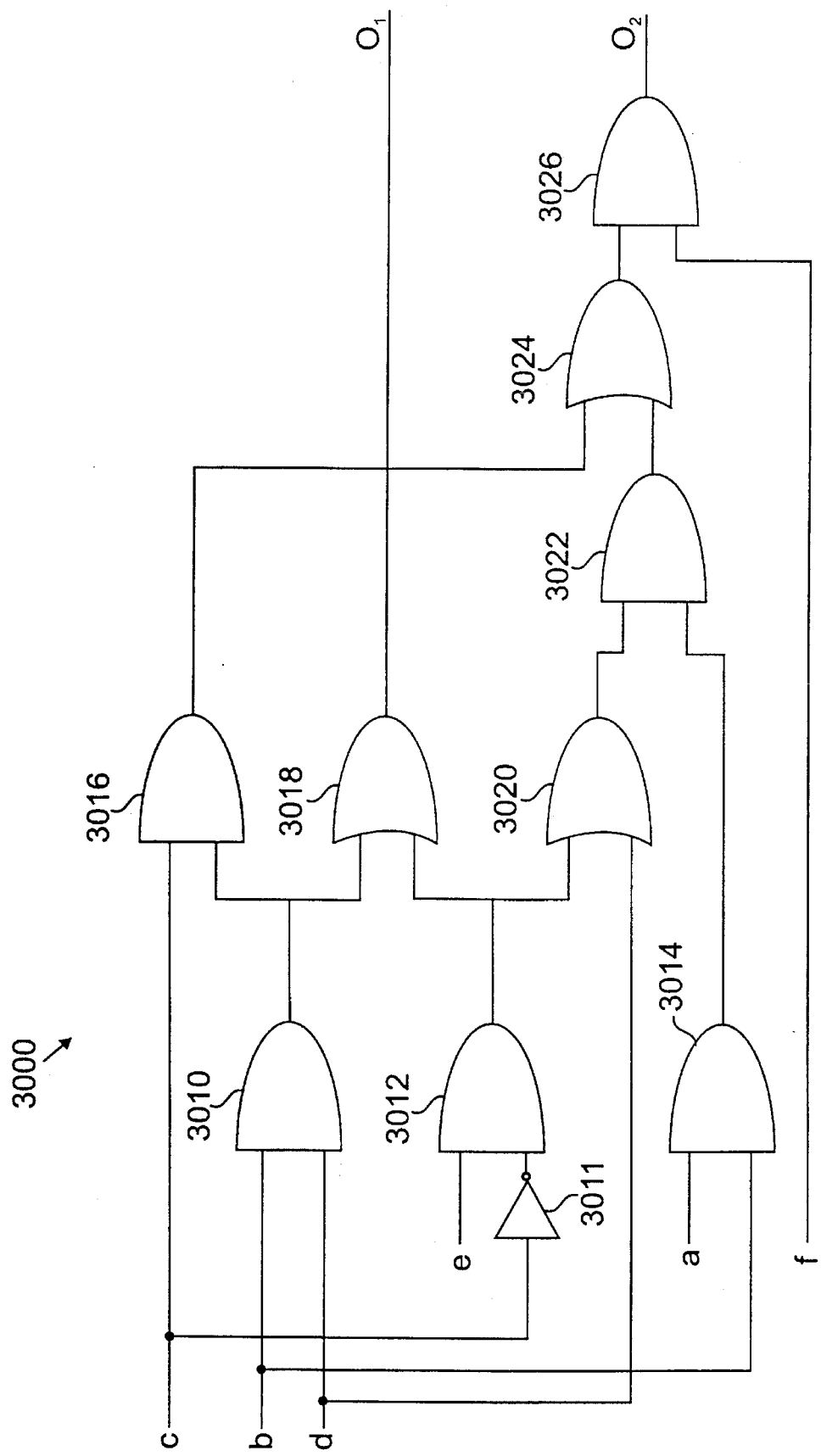
FIG. 11 is a network to be optimized using the method of this invention.
Figure 12:
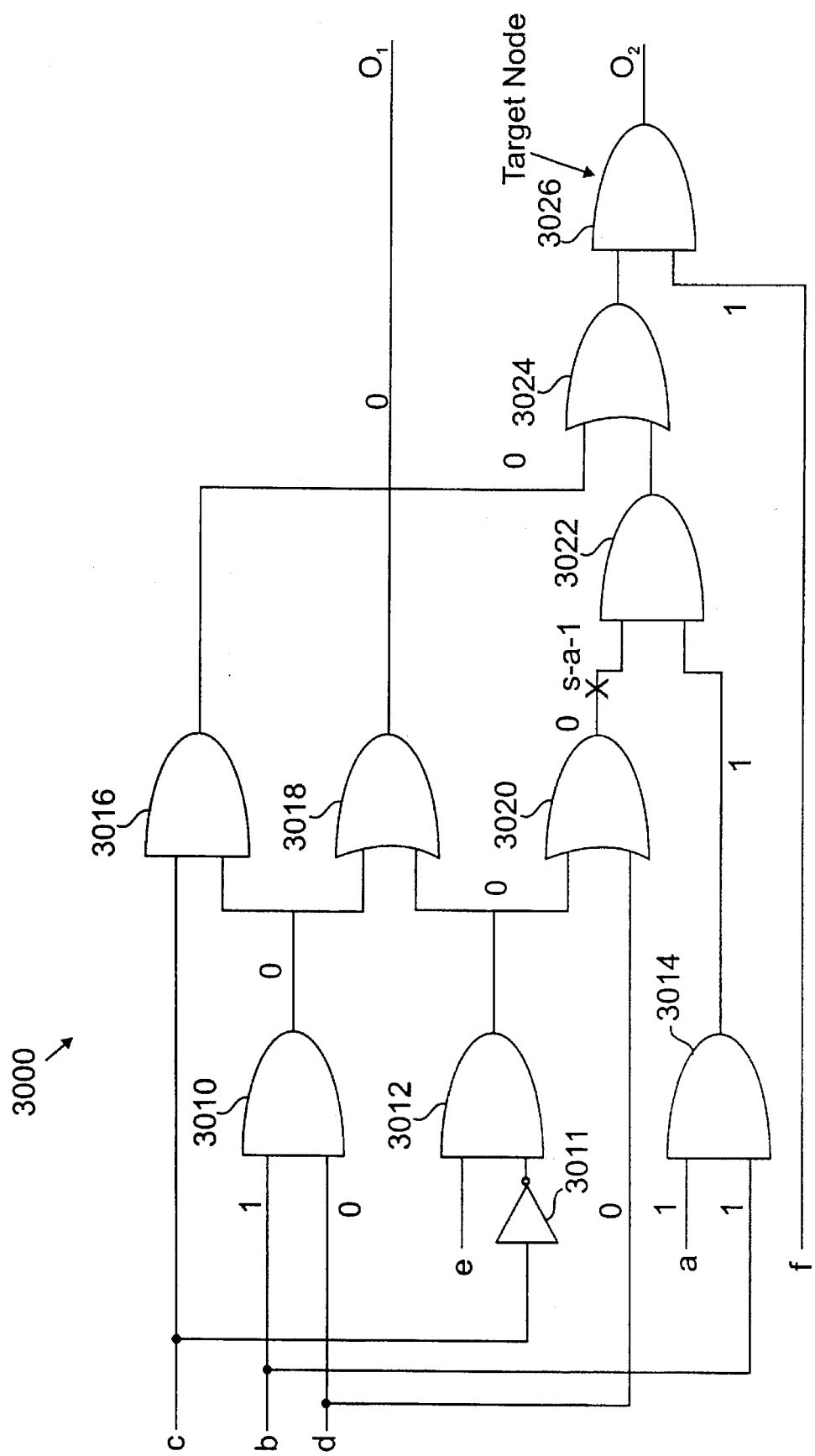
FIG. 12 is a reproduction of the network in FIG. 11 illustrating the performance of redundancy testing on a fault absolutely dominated by a target node for optimization of the network in FIG. 11.
Figure 13:
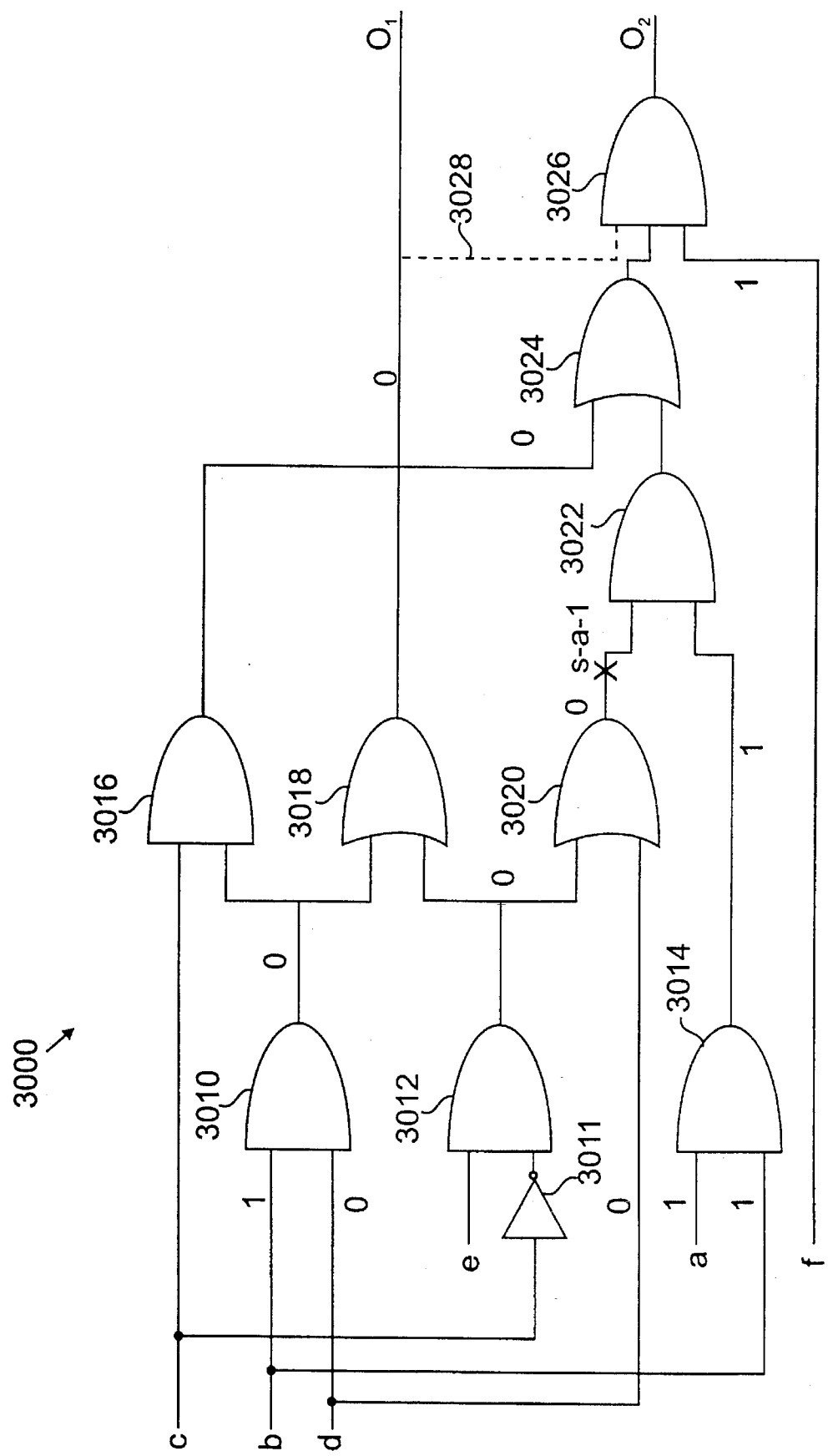
FIG. 13 is a reproduction of the network in FIG. 11 with the addition of a candidate connection.
Figure 14:
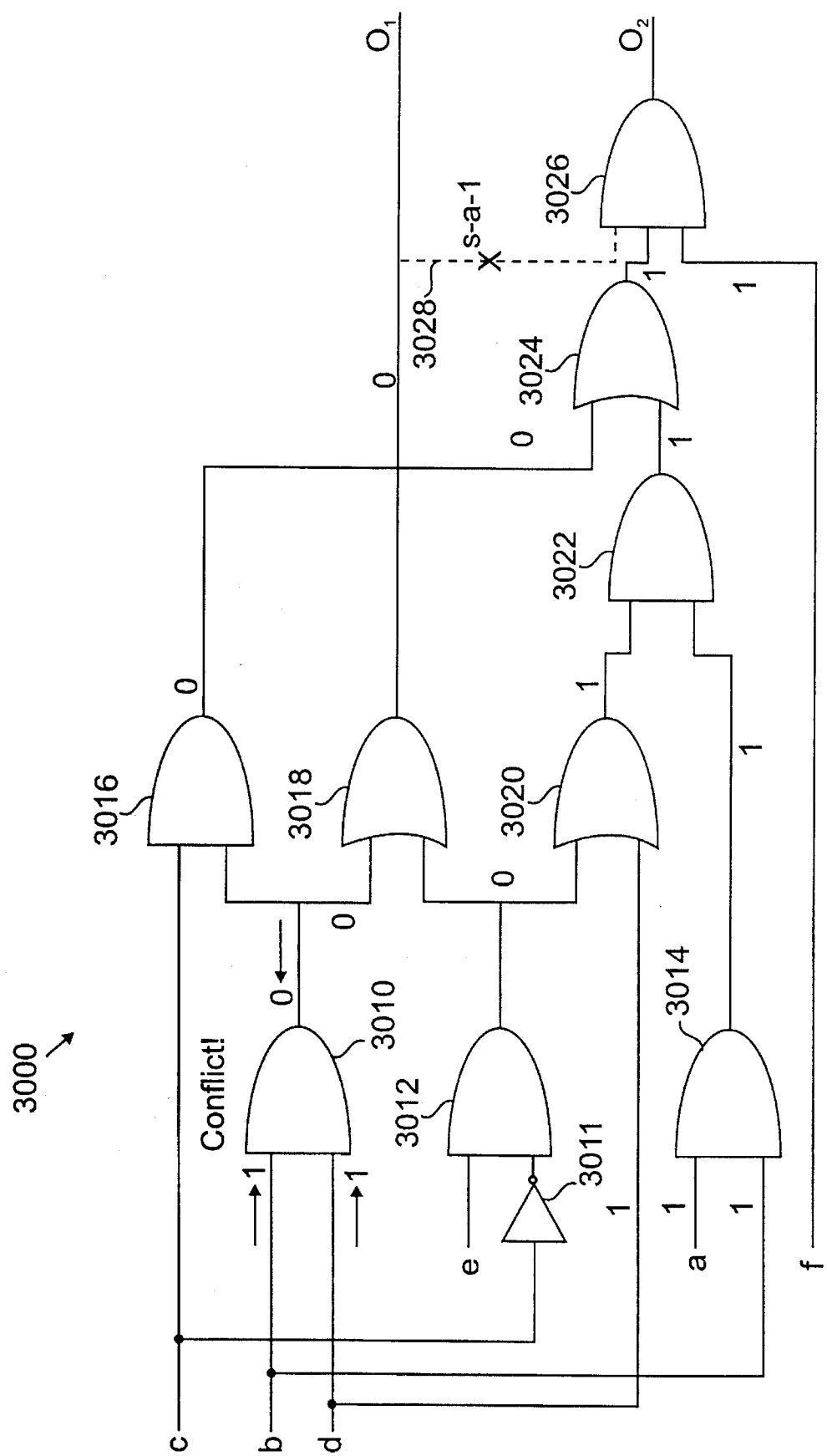
FIG. 14 is a reproduction of the network in FIG. 11 illustrating the performance of redundancy testing on the candidate connection added in FIG. 13.
Figure 15:
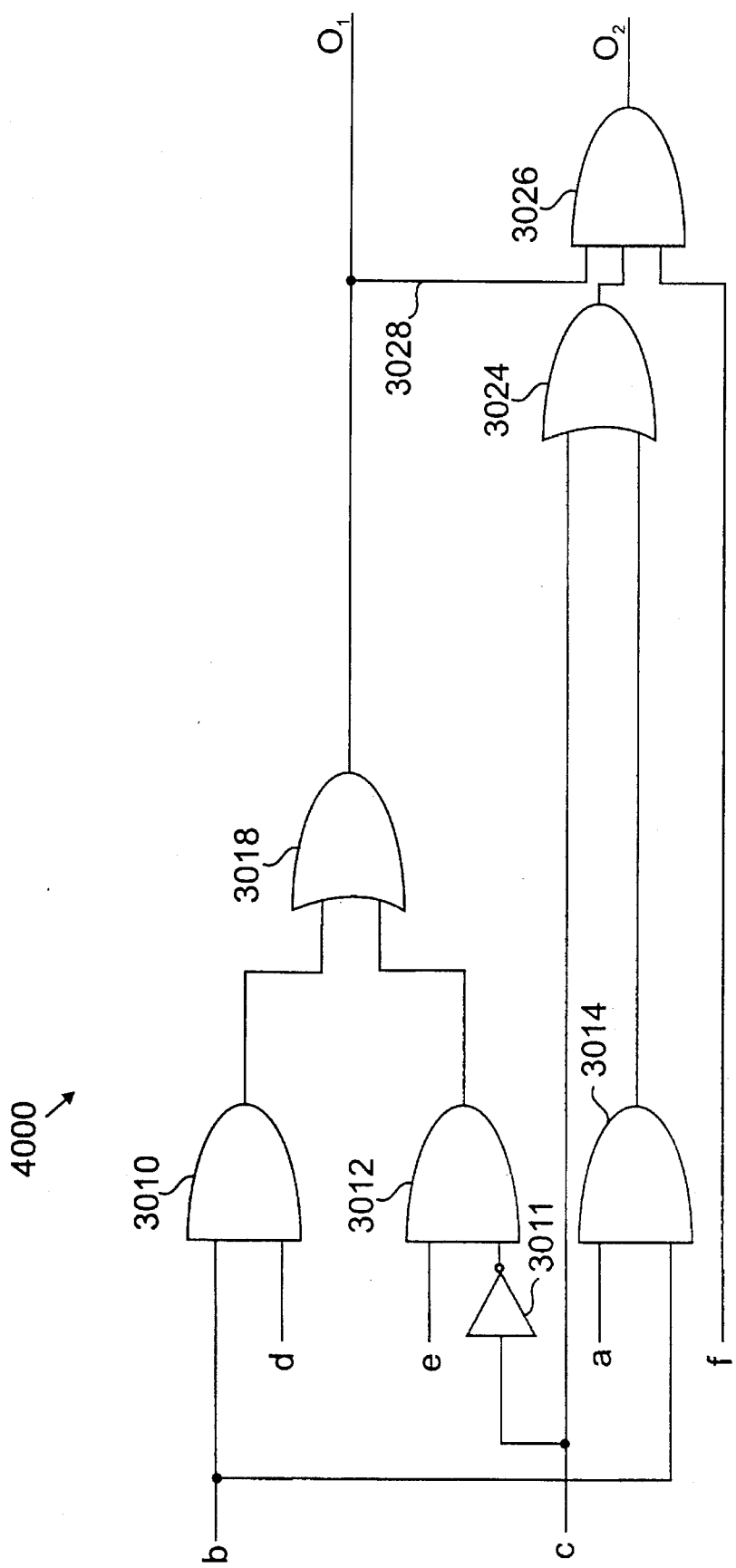
FIG. 15 is the optimized version of the network shown in FIG. 11.

The efficacy of the digital network optimizer in reducing the number of connections and logic units in a network is best illustrated by showing how the digital network optimizer optimizes a typical multi-level network. Therefore, the optimization process 1000 will be illustrated by applying it to a simple network 3000 shown in FIG. 11. FIG. 12 shows, on a reproduction of the network 3000, the set of mandatory assignments implicated during redundancy testing on a fault in the network 3000 absolutely dominated by the target node being optimized. FIG. 13 shows, on a reproduction of network 3000, a candidate connection suggested by the mandatory assignments implied during redundancy testing. FIG. 14 shows, on a reproduction of network 3000 with the suggested candidate connection added to the network, the set of mandatory assignments implicated during redundancy testing of the candidate connection for addition. FIG. 15 shows a network 4000, which is an optimized version of the network 3000.

The network 3000, as shown in FIGS. 11–14, consists of the six dual-input AND gates 3010, 3012, 3014, 3016, 3022 and 3026, the three dual-input OR gates 3018, 3020 and 3024, and the invertor 3011. Input signals b and d are connected as the inputs to AND gate 3010. The output of AND gate 3010 is connected as an input to AND gate 3016 and OR gate 3018. Input e and input c as inverted by invertor 3011 are connected as the inputs to AND gate 3012. The output of AND gate 3012 is connected as an input to OR gate 3018 and OR gate 3020. Inputs a and b are connected as the inputs to AND gate 3014. In addition, input d is connected as an input to OR gate 3020 and input c is connected as an input to AND gate 3016. The outputs of AND gate 3014 and OR gate 3020 are each connected as an input to AND gate 3022. The outputs of AND gates 3022 and 3016 are each connected as an input to OR gate 3024. The output of OR gate 3024 and input f are each connected as an input to AND gate 3026. The outputs of OR gate 3018 and AND gate 3026 are, respectively, $O_1$ and $O_2$.

The digital network optimizer performs an optimization iteration by completely optimizing each node in the network once. In many instances where a multi-level network comprising hundreds of thousands or millions of nodes is optimized, the digital network optimizer will perform many iterations on a network before it determines that the network cannot be further optimized. The performance of multiple iterations, however, may not be cost effective in terms of the computational cost for optimizing the network versus the extent that the network is optimized after the completion of these iterations. The digital network optimizer, therefore, in flow-step 50 provides an option for the setting of an upper constraint on the number of iterations to be performed on a network. If an upper constraint is not set, the digital network optimizer in flow-step 700 operates in the default condition of continually optimizing a network until a network is not further optimized at the completion of an optimization iteration. An alternative embodiment of the digital network optimizer further enhancing the cost effectiveness of the digital network optimizer provides an option for modifying the upper constraint interactively based on readings of elapsed optimization time and the number of iterations already performed.

The advantage of using the digital network optimizer to optimize a network is that the computational cost of considering all possible candidate connections for addition is reduced because only a limited number of candidate connections are considered simultaneously at every optimization iteration. The digital network optimizer, therefore, is an extremely powerful network transformation tool that can efficiently minimize the size of large and complex networks because it adds and removes redundancies at many nodes simultaneously during one iteration. An optimization iteration begins at flow-step 100 and ends when flow-step 700 is reached.

In flow-step 100, the digital network optimizer selects for optimization a target node. The target node initially selected is the node of the network having the greatest cost and not previously optimized during the current optimization iteration. After the initially selected target node is optimized, all other nodes in the network are optimized in cost descending order. Each node is only optimized once during an iteration, even if the network is modified in the course of an iteration. In other words, once a node is optimized, it will not be further optimized during a particular iteration. For example, for a network having ten nodes numbered 1 through 10, once node number 5 is optimized in the course of an iteration, the digital network optimizer will not re-optimize node number 5 during this iteration, regardless of whether the network is transformed during the optimization of other nodes. All nodes in a network, however, undergo optimization in a subsequent iteration, if any such iteration is performed.

Figure 4:
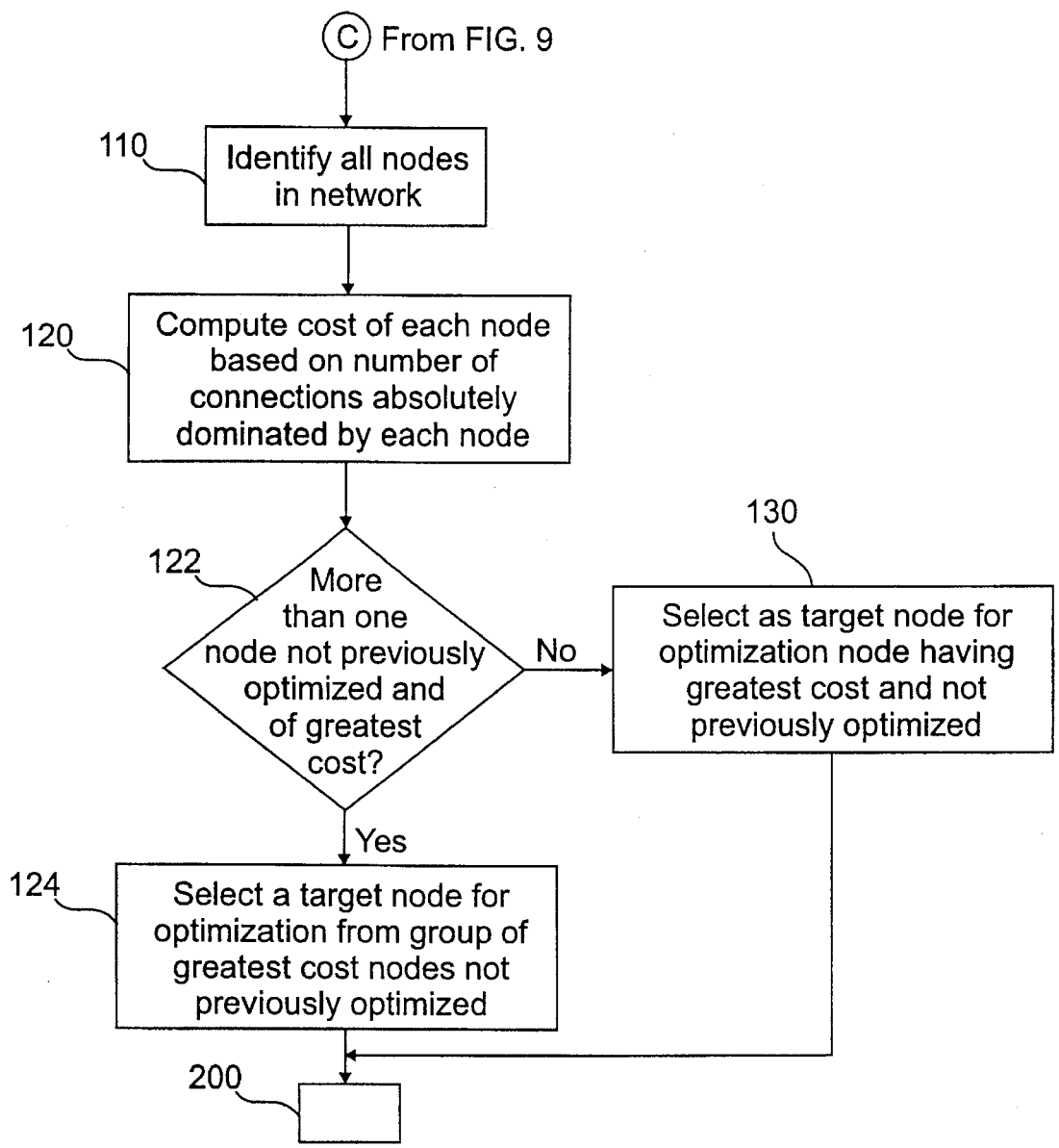
FIG. 4 is a flow diagram for the selection of a target node for optimization.

FIG. 4 shows the steps that are performed in flow-step 100. First, in step 110, the digital network optimizer identifies all nodes in a network. Then, in step 120, the digital network optimizer computes the cost of each node in the network. The cost of a node, as explained above, is determined by the number of connections that are absolutely dominated by the node. The highest cost node, of course, absolutely dominates the greatest number of connections in a network. In step 122, the digital network optimizer then determines whether more than one node from the set of nodes of the network not previously optimized during the current iteration is of greatest cost. In the case that there is only one node of greatest cost not previously optimized, the digital network optimizer in step 130 selects this node as the target node for optimization. Otherwise, in step 124, the digital network optimizer selects a target node for optimization from the group of nodes of greatest cost. The particular target node selected from this group of nodes does not matter for purposes of this invention.

In another embodiment, the digital network optimizer may optimize a network by optimizing only one node in a network. In a further embodiment, the digital network optimizer may select only the node of highest cost as the target node for optimization and only optimize this node of the network.

In optimizing the network 3000, the digital network optimizer initially would select AND gate node 3026 as the target node for optimization because this node absolutely dominates the largest number of connections in the network. While in actual practice all nodes in a network will be optimized at least once by the digital network optimizer during the performance of optimization process 1000, only the optimization of target node 3026 will be described in this discussion. For network 3000, the connections absolutely dominated by node 3026, in other words, those connections in the input tree of node 3026 and not shared with other nodes, are as follows: (c, 3016, 0), (3016, 3024, 0), (3024, 3026, 0), (d, 3020, 0), (3020, 3022, 0), (3022, 3024, 0), (a, 3014, 0), (b, 3014, 0), (3014, 3022, 0), (f, 3026, 0), (3012, 3020, 0) and (3010, 3016, 0).

After a target node is selected in flow-step 100, the digital network optimizer in flow-step 200 creates a partial fault list L containing faults f corresponding to those connections absolutely dominated by the target node. The connections selected in flow-step 200 for each target node to be optimized are the only connections upon which, in flow-step 300, redundancy testing is performed and a determination is made whether a candidate connection can be added to create a redundancy. This hierarchical process of examining selected connections of nodes of a network, with the nodes being selected for optimization in cost descending order, overcomes the problem experienced in the prior art of explicitly examining all possible connections for determining whether a connection should be added or not, and determining whether a specific stuck-at or connection fault is redundant. The present invention is advantageous because a reduced number of candidate connections for addition need to be considered at every iteration, and this reduced number of connections and the ones that create more redundancies can be identified in a very efficient manner.

As indicated above, in network 3000, the target node 3026 absolutely dominates connections (c, 3016, 0), (3016, 3024, 0), (3024, 3026, 0), (d, 3020, 0), (3020, 3022, 0), (3022, 3024, 0), (a, 3014, 0), (b, 3014, 0), (3014, 3022, 0), and (f, 3026, 0). The faults corresponding to these connections which would comprise the partial fault list for target node 3026 are: OR gate node 3024 stuck-at-1, input f stuck-at-1, AND gate node 3016 stuck-at-0, AND gate node 3022 stuck-at-0, connection (c, 3016, 0) stuck-at-1, connection (3010, 3016, 0) stuck-at-1, OR gate node 3020 stuck-at-1, AND gate node 3014 stuck-at-1, connection (3012, 3020, 0) stuck-at-0, (d, 3020, 0) stuck-at-0, connection (a, 3014, 0) stuck-at-1, and connection (b, 3014, 0) stuck-at-1. Henceforth, references to a functional gate node may be referred to simply as node x and the word "connection" may be omitted when reference is made to connection triple (-, -, -).

The digital network optimizer in flow-step 300 performs redundancy testing for each fault f in the partial fault list L for a target node. Faults which are found redundant are removed from the network. In addition, candidate connections for addition to the network suggested by the mandatory assignments implicated during redundancy testing of the faults f in the partial fault list L are collected for later processing. That the redundancy testing performed in flow-step 300 is only performed on select connections in the network, as opposed to all connections in a network, is particularly advantageous because there is an increased probability that the suggested candidate connections for addition would create a larger number of redundancies in the network. Also, for an extremely large and complex network, performing redundancy testing on fewer connections is desirable because it is well known that the problem of finding all the mandatory assignments for a particular fault cannot be resolved within a reasonable time for some faults.

Flow-step 300 is performed by the completion of several steps as shown in FIG. 5. To execute flow-step 300, the digital network optimizer in step 310 selects for redundancy testing a fault f from the partial fault list L that has not previously been tested for redundancy. If the digital network optimizer in step 315 determines that the selected fault is redundant, the fault is removed from the network in step 320. The digital network optimizer employs techniques well known in the art for removing the connections and gates in a network that correspond to a redundant fault. After performing step 320, the digital network optimizer in step 350 then determines whether any faults in the partial fault list L have not yet been tested for redundancy. If at least one fault in the partial fault list has not been tested, redundancy testing of faults in partial fault list L continues from step 310. Otherwise, if all faults in the partial fault list have been tested, the digital network optimizer performs flow-step 400.

In the case where the selected fault is irredundant, in the preferred embodiment, the digital network optimizer in step 330 examines the SMA for this fault to determine whether any implied mandatory assignment values exist at nodes outside the fanout cone and not in the input tree of the target node.

In a further embodiment, the digital network optimizer in step 330 determines whether any mandatory assignment values are implicated at nodes outside the fanout cone of the target node. An increased number of connections in a network would be examined by the digital network optimizer in this embodiment, resulting in an increase in the overall computational cost of optimizing a network. The probability of further minimizing a network so that it comprises fewer connections and components, however, also would increase because more candidate connection faults for addition are likely to be considered.

If any implied mandatory assignment values are identified in step 330, the digital network optimizer in step 340 saves data concerning these implied mandatory assignment values in memory 2012 for subsequent processing. The digital network optimizer, as further described in flow-steps 400 and 500, utilizes this data to identify any candidate connection for addition to the target node that would lead to an efficient minimization of the network. After the digital network optimizer completes step 340, the digital network optimizer performs step 350 as described above.

The following example illustrates the technique of using the implied mandatory values assigned during the redundancy testing performed in step 315 to suggest a candidate connection for addition to the network that would create other redundant connections. Suppose that the mandatory value v is assigned to node N during redundancy testing for fault f. Let A be a mandatory observation node for the fault f and let h be the controlling value of gate A. Then, by adding the connection C (N, A, 0) if v=h (or (N, A, 1) if v≠h), the necessary assignment N=$\bar{v}$ is added to SMA(f). This assignment is inconsistent with the previous mandatory value of node N, therefore, the fault f is made redundant by the addition of connection C. If adding connection C does not change the network's functionality (an examination performed separately at a later stage, in other words, at flow-step 500 in optimization process 1000), then the addition of this connection permits the removal of at least one connection somewhere else in the network. Similarly, for sequential circuits, if mandatory values are implied in the previous timeframe, connections can be added across timeframes by inserting flip-flops. In short, the addition of a candidate connection to a network forces the SMA for the fault being tested to become incompatible such that a new SMA is created for the fault being tested for redundancy. This technique of suggesting candidate connections can be generalized to more complex transformations involving the addition of several gates and wires.

The performance of flow-step 300 on target node 3026 of network 3000, therefore, would require that redundancy testing be performed on all the faults in the partial fault list for target node 3026. Only the results of redundancy testing on fault 3020 stuck-at-1 and the implementation of the preferred method of step 330 will be described here, as redundancy testing on this fault and use of the preferred method to identify candidate connections best illustrate the advantages of the digital network optimizer. In actual practice of the invention, all the faults in a partial fault list for a target node are tested for redundancy. The mandatory assignments implicated during redundancy testing on fault 3020 are graphically indicated on a reproduction of network 3000 as shown in FIG. 12.

Redundancy testing on fault 3020 stuck-at-1 requires that fault 3020 be set to the mandatory control assignment value of "0". The mandatory observation nodes for fault 3020 are nodes 3022, 3024 and 3026. Therefore, the side inputs to these mandatory observation nodes are set to the appropriate mandatory assignment values Node 3014 is set equal to "1" node 3016 is set equal to "0" and input f is set equal to "1". The mandatory assignment value of node 3020 set equal to "0" implies that node 3012 and input d are equal to "0". In addition, based on the mandatory assignment of node 3014 equal to "1", inputs a and b must be equal to "1". From these mandatory assignments, the mandatory assignment value of "0" is implicated at nodes 3010 and 3018. These mandatory assignments comprise the SMA for fault 3020. Based on the implication of mandatory assignment values, the SMA for fault 3020 stuck-at-1 would be found consistent because the justification of the SMA for fault 3020 did not find a conflict. Fault 3020 stuck-at-1 is not redundant and cannot be removed. FIG. 12 shows the SMA for fault 3020.

The digital network optimizer would now determine that node 3018 of network 3000 is the only node outside of the input and output cones of target node 3026. From an analysis of the set of mandatory assignment values for fault 3020 of network 3000, the digital network optimizer would find that node 3018 has an implied value that is the controlling value for gate 3026 because node 3026 is a mandatory observation node for fault 3020 stuck-at-1. This condition would suggest the addition of candidate connection (3018, 3026, 0) to the network, labeled connection 3028 in FIGS. 13, 14 and 15. In addition, redundancy testing on fault (3010, 3016, 0) stuck-at-1 would find it irredundant and that a mandatory assignment value of "0" is implied at node 3018. Therefore, fault (3010, 3016, 0) stuck-at-1 also would suggest the addition of candidate connection (3018, 3026, 0). In addition, redundancy testing on all the other faults in the partial fault list for target node 3026 would find that faults 3016 stuck-at-0, connection (c, 3016, 0) stuck-at-1, (3012, 3020, 0) stuck-at-0 and (d, 3020, 0) stuck-at-0 are irredundant and that a mandatory assignment value of "1" is implied at node 3018 for all these faults. Therefore, each of these faults would suggest the addition of candidate connection (3018, 3026, 1). In the actual practice of this invention, data representative of these suggested candidate connections would preferably be saved in memory by the digital network optimizer for later processing.

After the digital network optimizer removes redundant faults and saves data indicating any suggested candidate connections in flow-step 300, the digital network optimizer in flow-step 400 creates an optimization table OT for the target node. The optimization table correlates a particular fault of the partial fault list to the suggested candidate connection, which if added to the network, makes the particular fault redundant. The data found in the optimization table is stored by processor 2010 in memory 2012.

Figure 6:
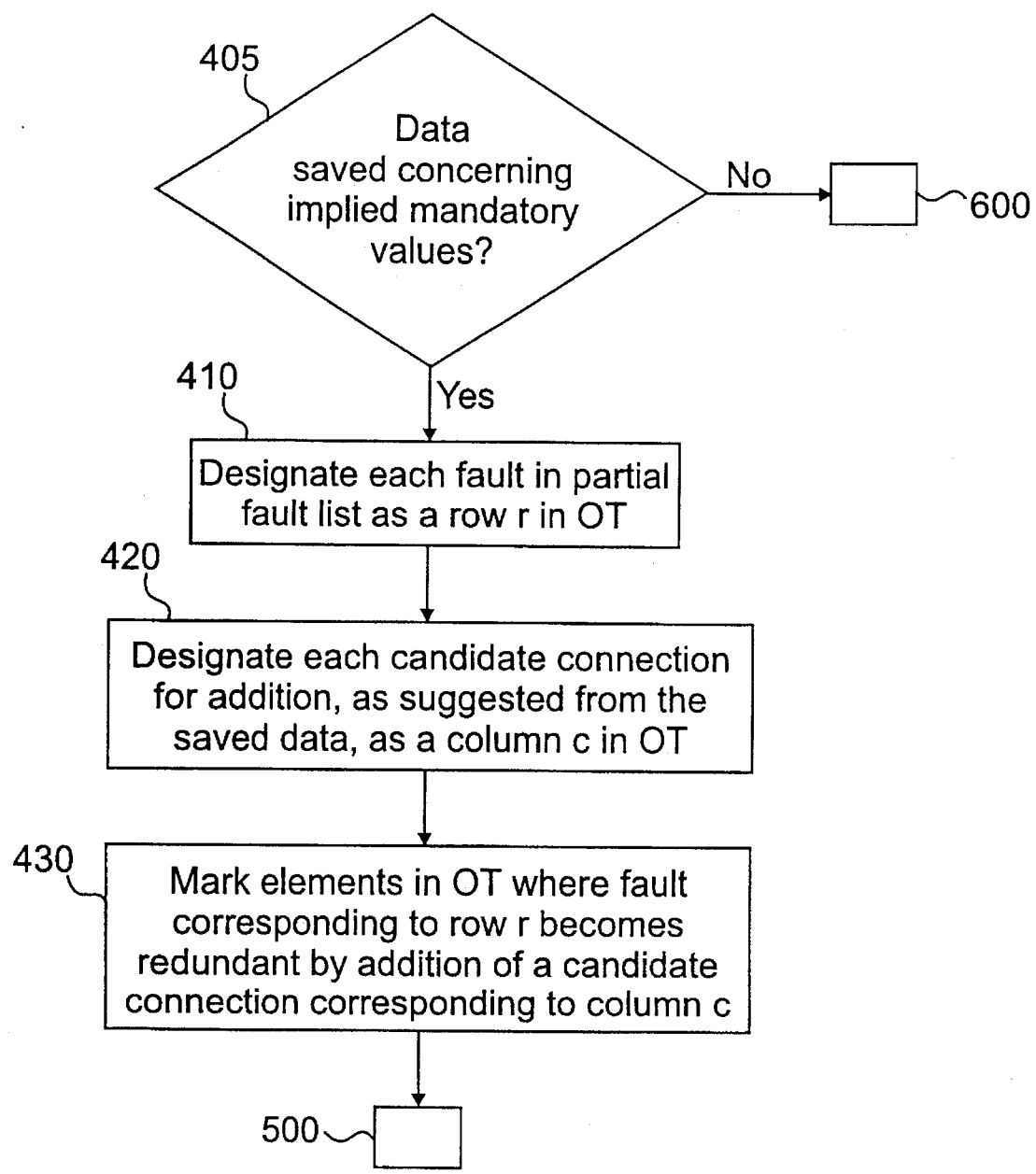
FIG. 6 is a flow diagram for the generation of an optimization table for the target node.

The generation of the optimization table in flow-step 400 requires the performance of the following steps as shown in FIG. 6. In step 405, the digital network optimizer initially determines whether any data was saved in memory concerning a candidate connection for addition suggested during the performance of redundancy testing on the faults in the partial fault list. If no candidate connection was suggested, the digital network optimizer then performs flow-step 600. If at least one candidate connection for addition was suggested, the digital network optimizer begins the creation of an optimization table from step 410. In step 410, each fault in the partial fault list for the target node is designated to correspond to a row r in the optimization table and each candidate connection for addition to the target node suggested by the data saved in step 340 is designated to correspond to a column c in the optimization table. If a fault corresponding to a row r becomes redundant in the presence of a candidate connection corresponding to a column c, then the element in row r and column c of the optimization table is marked in step 430. At least one element for every column will be marked in an optimization table generated for a target node. More than one element may be marked in the same column, since adding one connection may make more than one fault redundant. In addition, more than one element may be marked in the same row, as a given fault may become redundant by the addition of several candidate connections, one at a time.

Next, an optimization table for target node 3026 of network 3000 is created. The complete optimization table for target node 3026 is shown in Table 1. From redundancy testing, it was determined that faults 3020 stuck-at-1 and (3010, 3016, 0) stuck-at-1 suggested the addition of candidate connection (3018, 3026, 0). Therefore, for column candidate connection (3018, 3026, 0), a mark would be placed in rows 3020 stuck-at-1 and (3010, 3016, 0) stuck-at-1. Further, it was found that faults 3016 stuck-at-0, connection (c, 3016, 0) stuck-at-1, (3012, 3020, 0) stuck-at-0, and (d, 3020, 0) stuck-at-0 suggested the addition of candidate connection (3018, 3026, 1). Consequently, the respective rows for these faults are marked for column candidate connection (3018, 3026, 1).

TABLE 1

|  |  | (3018, 3026, 0) | (3018, 3026, 1) |
|---|---|---|---|
| 3024 | s-a-1 | | |
| (f, 3026, 0) | s-a-1 | | |
| 3016 | s-a-0 | | X |
| 3022 | s-a-0 | | |
| (c, 3016, 0) | s-a-1 | | X |
| (3010, 3016, 0) | s-a-1 | X | |
| 3020 | s-a-1 | X | |
| 3014 | s-a-1 | | |
| (3012, 3020, 0) | s-a-0 | | X |
| (d, 3020, 0) | s-a-0 | | X |
| (a, 3014, 0) | s-a-1 | | |
| (b, 3014, 0) | s-a-1 | | |

After an optimization table has been created in flow-step 400, the digital network optimizer in flow-step 500 selects a candidate connection for addition to test for redundancy and then evaluates whether its addition would permit the transformation of the network to a more optimized form. The steps comprising flow-step 500 are explained below in further detail by reference to FIG. 7, which shows the steps executed by the digital network optimizer in determining the order in which redundancy testing is performed on any suggested candidate connection, and by reference to FIG. 8, which shows the steps executed by the digital network optimizer in testing whether a candidate connection for addition is redundant and deciding whether a redundant candidate connection should be added to the network.

In step 501, the digital network optimizer first determines whether any candidate connection in the optimization table as suggested during redundancy testing of the faults in the partial fault list has not yet been tested for redundancy. If all candidate connections have been tested for redundancy, the target node cannot be further optimized. The digital network optimizer then performs flow-step 600.

In the case where at least one candidate connection in the optimization table has not yet been tested for redundancy, the digital network optimizer in step 505 determines whether there is only one candidate connection in the optimization table that has not been previously selected for redundancy testing. The digital network optimizer in step 508 selects this candidate connection as the candidate connection for addition if it was the only untested candidate connection in the optimization table. The digital network optimizer then performs redundancy testing on this candidate connection beginning at step 550 as shown in FIG. 8 and explained below.

On the other hand, if more than one candidate connection in the optimization table has not been tested for redundancy, the digital network optimizer continues the process steps of deciding which candidate connection to select for redundancy testing. The first criteria for selection of a candidate connection for redundancy testing is based on the cost of a fault made redundant by the addition of a candidate connection. The cost of a fault is defined as the number of connections that can be removed if the fault is redundant. The digital network optimizer attempts to select the candidate connection which, if added to the network, makes the marked fault of highest cost redundant. Accordingly, in step 511, the digital network optimizer determines whether there is more than one highest cost marked fault in the optimization table. If there is more than one highest cost marked fault in the optimization table, the digital network optimizer in step 512 selects one fault from the group of highest cost marked faults as the highest cost marked fault. The particular fault selected from this group of faults does not matter for purposes of this invention. If the digital network optimizer then determines in step 515 that the highest cost marked fault is made redundant by only one candidate connection, then this candidate connection is selected for addition to the network by the digital network optimizer in step 517, and the digital network optimizer proceeds to perform step 550.

If the digital network optimizer in step 515 determines that the highest cost marked fault is made redundant by several candidate connections, the digital network optimizer in step 520 computes the sum of the cost of all the marked faults for each of these candidate connections. If the digital network optimizer in step 525 determines that the highest sum cost for all marked faults for a particular candidate connection is reached by more than one candidate connection, a candidate connection for addition is selected in step 540 from these candidate connections. The particular connection selected from this group of connections does not matter for purposes of this invention. Otherwise, the candidate connection having the highest total sum cost is selected for addition in step 530. In either case, the digital network optimizer then performs step 550.

Figure 8:
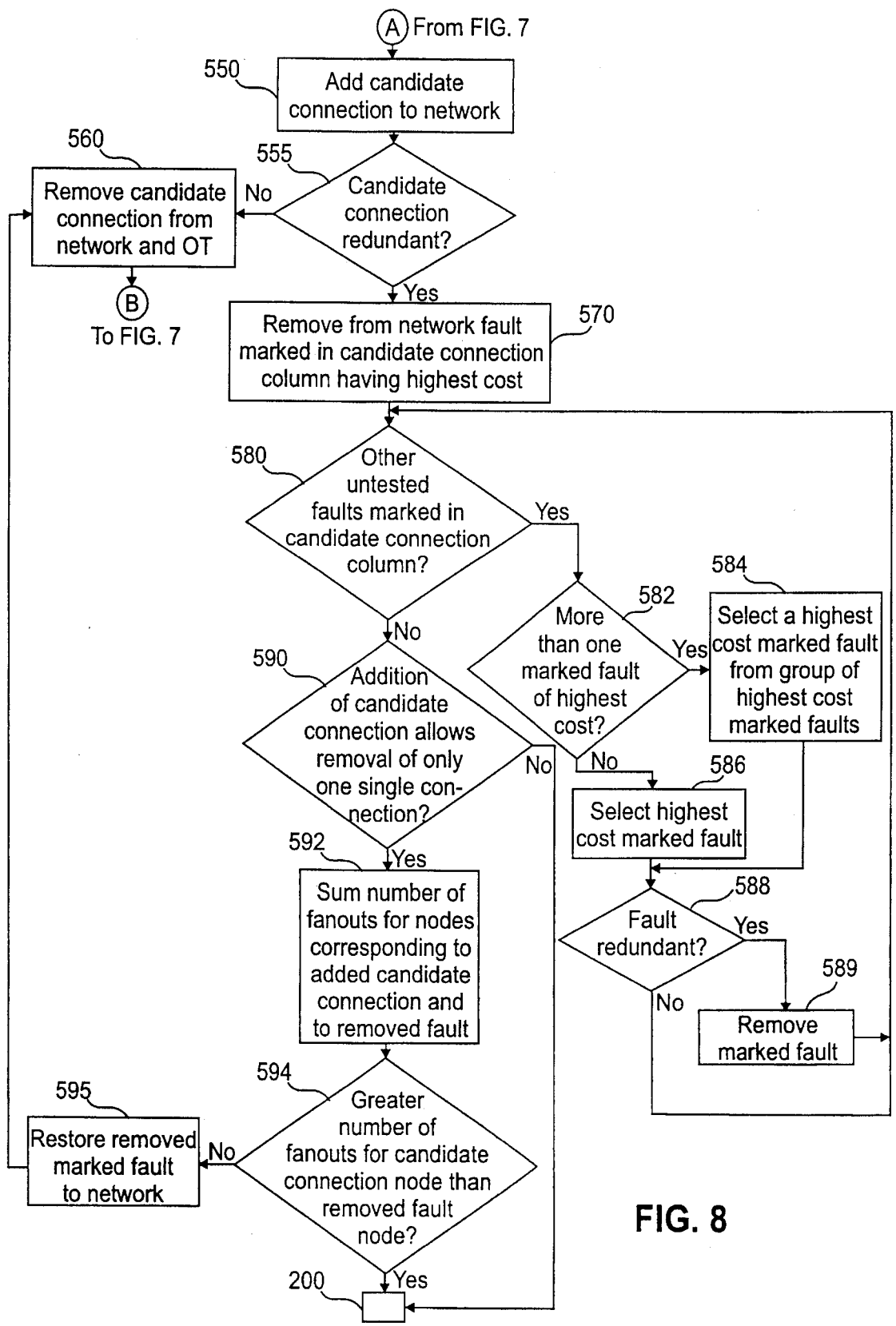
FIG. 8 is a flow diagram for performing the process of verifying that a candidate connection is redundant and for the determination whether the addition of a candidate connection to the network permits efficient minimization of the network.

As shown in FIG. 8, after the selection of a candidate connection for addition, the digital network optimizer in step 550 adds the selected candidate connection to the network. If, in step 555, this candidate connection is found irredundant after the performance of a redundancy test, the digital network optimizer in step 560 eliminates the column corresponding to this candidate connection from the set of possible candidate connections indicated in the optimization table and removes the candidate connection from the network being optimized. This candidate connection is no longer considered at this point because redundancy testing demonstrated that it cannot be added to the network without affecting the external behavior of the network. In these circumstances, the digital network optimizer then proceeds to perform step 501, where it attempts to select another candidate connection for addition.

Otherwise, if a candidate connection is found redundant in step 555, the added connection remains a part of the network being optimized (at least temporarily) and the digital network optimizer then in step 570 removes from the network the highest cost fault marked in the column corresponding to this candidate connection. If the digital network optimizer in step 580 determines that at least one other row is marked in this column, the digital network optimizer in step 582 then determines whether more than one of these marked faults is the highest cost fault marked in the column. If it is determined in step 582 that there is more than one highest cost marked fault, a fault from these marked faults is selected in step 584 as the highest cost marked fault. The particular fault selected from this group of faults does not matter for purposes of this invention. Otherwise, the digital network optimizer in step 586 selects the highest cost marked fault. In either case, the digital network optimizer then performs step 588 to determine whether the selected highest cost marked fault is redundant. If the highest cost marked fault is redundant, this marked fault is removed from the network in step 589. After removal of this marked fault or a finding that this marked fault is not redundant, the digital network optimizer then performs step 580. Steps 580–589 are repeatedly performed until all marked faults in the column under consideration have been tested for redundancy.

The addition of a connection to a network, however, does not always cause all marked faults for a candidate connection column to become redundant, such that all these faults may be removed from a network. If the addition of one candidate connection results in the removal of only one single connection, no improvement in minimizing the logic in the circuit is achieved. In that case, the additional candidate connection constitutes an alternative connection for the removed connection. The addition of this particular candidate connection, in such a circumstance, does not influence the optimization of the current target node, but may influence the optimization of other nodes. For example, the addition of a connection from a single fanout node may prevent the removal of this node later in the optimization process. The addition of candidate connections from primary inputs or primary outputs, therefore, is preferred to those connections from functional nodes. Among the functional nodes, those nodes with the highest fanout are preferably retained in the network because the probability of removing more connections from the network at a later step in the optimization process increases. Thus, whether a candidate connection is added to a network by the digital network optimizer in this circumstance depends on the probability that more redundancies will be removed in subsequent steps because of the addition of the connection.

The implementation of the criteria concerning the addition of a connection and the concomitant removal of a fault which only allows the removal of one single connection is performed in steps 590 through 594 of flow-step 500. After the digital network optimizer tests all the marked faults in the selected candidate connection column for redundancy and removes any redundant marked fault, the digital network optimizer in step 590 determines whether only a single redundant connection has been removed from the network by the addition of a candidate connection. If more than one redundant connection has been removed, the digital network optimizer then proceeds to perform step 200 where a partial fault list is generated for the same target node for the newly modified network. Ceasing optimization of the present network, in these circumstances, is the most efficient way of minimizing a network because once a network has been modified, the mandatory assignment values previously collected for the faults in the partial fault list of the target mode become invalidated. Utilization of this now obsolete data would decrease the probability of further optimizing the network.

If only one redundant connection can be removed, the digital network optimizer in step 592 computes the sum of the number of fanouts for the node corresponding to the candidate connection added to the network and the sum of the number of fanouts for the node corresponding to the fault removed from the network. If the digital network optimizer in step 594 determines that the node corresponding to the candidate connection has the greater sum, further optimization of the target node for the present network ceases and this same target node is re-optimized starting from step 200. If the sums are the same or the node corresponding to the fault removed has a greater number of fanouts, the fault previously removed is restored to the network being optimized in step 595 and the digital network optimizer continues optimization of the network from step 560. In performing network optimization, especially where the sums of the fanouts are the same, it has been found experimentally that it is more efficient to continue optimizing the present network, rather than re-optimizing the target node based on the new network, because it has been experimentally proven that modification of the network would result in more steps for an optimization iteration. Efficient optimization is achieved in these circumstance because maintaining the network status quo would increase the probability of minimization in later optimization steps.

After a target node has been completely optimized by the performance of flow-steps 200, 300, 400 and 500, the digital network optimizer in flow-step 600 then determines whether all nodes in the network have been optimized. If this condition is not satisfied, the digital network optimizer continues optimization of the network from step 122. Otherwise, an optimization iteration has been completed and the digital network optimizer performs flow-step 700.

In flow-step 700, the digital network optimizer decides whether to perform another optimization iteration on a network. The steps involved in flow-step 700 are set forth in detail in FIG. 9. The digital network optimizer first determines in step 710 whether the size of the network has been minimized during the optimization iteration just completed. If the network has not been minimized, optimization of the network by the digital network optimizer is complete and the digital network optimizer performs flow-step 800. If, however, the network has been minimized, the digital network optimizer then in step 720 determines whether the number of optimization iterations that have been performed equals any upper constraint that has been set in flow-step 50. If an upper constraint has been attained, the digital network optimizer then performs flow-step 800. Otherwise, the digital network optimizer continues optimization of the network and performs another optimization iteration on the transformed network starting at flow-step 100.

Continuing with the optimization of target node 3026 of network 3000, the digital network optimizer would determine that fault 3020 stuck-at-1 is the highest cost fault marked in the optimization table Table 1 for target node 3026. Therefore, candidate connection for addition (3018, 3026, 0) would be selected for addition to the network because it makes fault 3020 redundant. The digital network optimizer would add candidate connection (3018, 3026, 0) or connection 3028 to the network, and then perform redundancy testing on fault (3018, 3026, 0) stuck-at-1. As shown in FIG. 14, the mandatory assignment values which would be obtained by the performance of redundancy testing on fault (3018, 3026, 0) stuck-at-1 are: node 3018 set to the controlling value "0" and side inputs f and node 3024 to mandatory observation node 3026 set equal to "1". The justification of these mandatory assignments to other nodes in the network finds that nodes 3022, 3020, 3014 must be equal to "1". For node 3014 equal to "1", inputs a and b must be equal to "1". Also, for node 3018 equal to "0", nodes 3010 and 3012 must be equal to "0". If node 3020 is equal to "1" and node 3012 is equal to "0" then input d must be equal to "1". This causes a conflict in that if b and d are equal to "1" node 3010 cannot be equal to "0" as previously indicated. Therefore, redundancy testing for this candidate connection would find that the SMA for this fault is incompatible. Therefore, the gates and connections corresponding to fault 3020 would be removed from the network at this point of the optimization iteration.

Redundancy testing on fault (3010, 3016, 0), the other fault marked in the column corresponding to the candidate connection (3018, 3026, 0), also would find this fault redundant. The network therefore would be further reduced by the removal of the redundant connections corresponding to fault (3010, 3016, 0). The network having the above addition and removals would now be re-optimized for target node 3026 since no further rows are marked in the optimization table Table 1 for the column corresponding to candidate connection (3010, 3016, 0). Completion of redundancy testing for target node 3026 and for all remaining nodes in the network would find that no further minimization of the network is possible. An optimized version of network 3000 based on the optimization of target node 3026 is shown as network 4000 in FIG. 15.

After the digital network optimizer decides in flow-step 700 that no further optimization iterations are required, the digital network optimizer in step 800 indicates the results of the optimization. Any connections that have been added and removed in the course of any transformation of the original network into a smaller optimized network, as stored in memory 2012, can be indicated by the digital network optimizer either graphically on monitor 2002 or as data representative of a change in the structure of the original circuit that can be saved in another memory device, such as a computer disk.

It is to be understood that the embodiments and variations shown and described above are illustrative of the principles of this invention only and that various modifications may be implemented by those skilled in the art without departing from the scope and spirit of the invention.

We claim:

1. A method of efficiently optimizing a digital logic network through the iterative addition and removal of redundant connections previously identified as candidate connections comprising the steps of:

selecting a target node for optimization;

analyzing the digital logic network to determine if connections to the target node are absolutely dominated by said target node, by determining if each of said connections must pass through the target node before reaching any primary output of the digital logic network;

performing redundancy testing on each fault corresponding to each connection previously determined to be absolutely dominated;

removing from the digital logic network each said fault found redundant;

identifying each candidate connection for addition suggested by an assignment value implicated during redundancy testing; and adding to the network each said candidate connection found redundant.

2. The method of claim 1, further comprising the step of removing from the network a connection made redundant by said addition.

3. The method of claim 1, further comprising the step of computing the cost of each node of the network and selecting a node of the network having the highest cost as the target node.

4. The method of claim 3, wherein each said candidate connection is identified based on an assignment value implicated at a node outside the fanout cone and not in the input tree of said target node.

5. The method of claim 3, wherein each said candidate connection is identified based on an assignment value implicated at a node outside the fanout cone of the target node.

6. The method of claim 2, further comprising the step of computing the cost of each node of the network and selecting a node of the network having the highest cost as the target node.

7. The method of claim 6, wherein each said candidate connection is identified based on an assignment value implicated at a node outside the fanout cone and not in the input tree of said target node.

8. The method of claim 7, further comprising the step of creating for said target node an optimization table comprising at least one said suggested candidate connection for addition and at least one said connection made redundant by the addition to the network of said at least one candidate connection.

9. The method of claim 8, wherein each said fault and any said candidate connection for said target node, respectively, is a row and a column of said optimization table.

10. The method of claim 9, further comprising the step of marking a row in said optimization table in any column suggested by the fault corresponding to said row.

11. The method of claim 10, further comprising the step of selecting each candidate connection in descending order for redundancy testing according to which candidate connection not previously tested for redundancy makes the highest cost marked fault become redundant.

12. The method of claim 10, further comprising the step of selecting each candidate connection in descending order for redundancy testing according to which candidate connection not previously tested for redundancy has the highest sum cost of marked faults.

13. The method of claim 11, further comprising the step of selecting the candidate connection having the highest sum cost of marked faults for redundancy testing where the highest cost marked fault makes more than one candidate connection redundant.

14. The method of claim 6, wherein each said candidate connection is identified based on an assignment value implicated at a node outside the fanout cone of the target node.

15. The method of claim 14, further comprising the step of creating for said target node an optimization table comprising at least one said suggested candidate connection for addition and at least one said connection made redundant by the addition to the network of said at least one candidate connection.

16. The method of claim 15, wherein each said fault and any said candidate connection for said target node, respectively, is a row and a column of said optimization table.

17. The method of claim 16, further comprising the step of marking a row in said optimization table in any column suggested by the fault corresponding to said row.

18. The method of claim 17, further comprising the step of selecting each candidate connection in descending order for redundancy testing according to which candidate connection not previously tested for redundancy makes the highest cost marked fault become redundant.

19. The method of claim 17, further comprising the step of selecting each candidate connection in descending order for redundancy testing according to which candidate connection not previously tested for redundancy has the highest sum cost of marked faults.

20. The method of claim 18, further comprising the step of selecting the candidate connection having the highest sum cost of marked faults for redundancy testing where the highest cost marked fault makes more than one candidate connection redundant.

21. A method of efficiently optimizing a digital logic network through the iterative addition and removal of redundant connections previously identified as candidate connections comprising the steps of:

selecting in cost descending order a node of the network not previously selected as a target node for optimization, and in succession for each said target node selected, analyzing the digital logic network to determine if connections to each said target node selected are absolutely dominated by each said target node, by determining if each of said connections must pass through each said target node before reaching any primary output of the digital logic network;

performing redundancy testing on each fault corresponding to each connection previously determined to be absolutely dominated by assigning values to the nodes of the network;

removing each said fault found redundant from the network and identifying each candidate connection for addition suggested by an assignment value implicated during redundancy testing; and adding to the network each said candidate connection found redundant.

22. The method of claim 21, further comprising the step of removing from the network a connection made redundant by said addition.

23. The method of claim 22, wherein each said candidate connection is identified based on an assignment value implicated at a node outside the fanout cone and not in the input tree of said target node.

24. The method of claim 21, wherein optimization of the network continues until the network cannot be further optimized.

25. The method of claim 24, wherein optimization of the network ceases before a determination is made that the network cannot be further optimized.

26. The method of claim 23, further comprising the step of creating for said target node an optimization table comprising at least one said suggested candidate connection for addition and at least one said connection made redundant by the addition to the network of said at least one candidate connection.

27. The method of claim 26, wherein each said fault and any said candidate connection for said target node, respectively, is a row and a column of said optimization table.

28. The method of claim 27, further comprising the step of marking a row in said optimization table in any column suggested by the fault corresponding to said row.

29. The method of claim 28, further comprising the step of selecting each candidate connection in descending order for redundancy testing according to which candidate connection not previously tested for redundancy makes the highest cost marked fault become redundant.

30. The method of claim 28, further comprising the step of selecting each candidate connection in descending order for redundancy testing according to which candidate connection not previously tested for redundancy has the highest sum cost of marked faults.

31. The method of claim 29, further comprising the step of selecting the candidate connection having the highest sum cost of marked faults for redundancy testing where the highest cost marked fault makes more than one candidate connection redundant.

32. The method of claim 31, wherein, where any connection made redundant by the addition of a candidate connection to a particular target node has been removed from the network, redundancy testing of said particular target node continues from the step of identifying each fault corresponding to each connection absolutely dominated by said particular target node.

33. The method of claims 32, wherein a candidate connection found redundant is not added to the network and the only one connection made redundant by addition of said redundant candidate connection is not removed from the network where the number of fanouts of the node corresponding to said one redundant connection is greater than the number of fanouts of the node corresponding to said redundant candidate connection.

34. The method of claim 33, wherein optimization of the network continues until the network cannot be further optimized.

35. The method of claim 34, wherein optimization of the network ceases before a determination is made that the network cannot be further optimized.

36. An apparatus for efficiently optimizing a digital logic network through the iterative addition and removal of redundant connections previously identified as candidate connections comprising;

a means for selecting a target node for optimization;

a means for analyzing the digital logic network to determine if connections to said target node are absolutely dominated by said target node, by determining if each of said connections must pass through said target node before reaching and primary output of the digital logic network;

a means for performing redundancy testing on each fault corresponding to each connection previously determined to be absolutely dominated by assigning mandatory values to the nodes of the network;

a means for removing each said fault found redundant from the network;

a means for identifying each candidate connection for addition suggested by a mandatory value assigned during redundancy testing; and a means for adding any said candidate connection found redundant to the network.

37. The apparatus of claim 36, further comprising a means for removing from the network any connection made redundant by said addition.

38. The apparatus of claim 37, further comprising a means for determining whether to continue optimization of the network.

* * * * *